United States Patent
Morczinek et al.

(10) Patent No.: US 11,599,689 B2
(45) Date of Patent: *Mar. 7, 2023

(54) METHODS AND APPARATUS FOR AUTOMATICALLY DEFINING COMPUTER-AIDED DESIGN FILES USING MACHINE LEARNING, IMAGE ANALYTICS, AND/OR COMPUTER VISION

(71) Applicant: AirWorks Solutions, Inc., Cambridge, MA (US)

(72) Inventors: David Morczinek, Cambridge, MA (US); Maxim Doubenski, Boston, MA (US); Adam Kersnowski, Wellesley, MA (US); Mirela Petkova, Boston, MA (US); Nikhil Shinday, San Francisco, CA (US)

(73) Assignee: AIRWORKS SOLUTIONS, INC., Cambridge, MA (US)

( * ) Notice: Subject to any disclaimer, the term of this patent is extended or adjusted under 35 U.S.C. 154(b) by 113 days.

This patent is subject to a terminal disclaimer.

(21) Appl. No.: 16/897,877

(22) Filed: Jun. 10, 2020

(65) Prior Publication Data

US 2021/0124855 A1 Apr. 29, 2021

Related U.S. Application Data

(63) Continuation of application No. 16/179,401, filed on Nov. 2, 2018, now Pat. No. 10,719,641.
(Continued)

(51) Int. Cl.
*G06F 30/20* (2020.01)
*G06N 20/00* (2019.01)
(Continued)

(52) U.S. Cl.
CPC .......... *G06F 30/20* (2020.01); *G06K 9/6296* (2013.01); *G06N 20/00* (2019.01); *G06T 3/4038* (2013.01);
(Continued)

(58) Field of Classification Search
CPC .......... G06F 30/20; G06F 30/27; G06F 30/13; G06K 9/6296; G06N 20/00; G06N 5/003;
(Continued)

(56) References Cited

U.S. PATENT DOCUMENTS 9,679,227 B2   6/2017   Taylor et al.
9,928,448 B1   3/2018   Merler et al.
(Continued)

OTHER PUBLICATIONS

International Search Report and Written Opinion of the International Searching Authority for International Application No. PCT/US2018/058953, dated Jan. 18, 2019.
(Continued)

*Primary Examiner* — Christopher M Brandt
(74) *Attorney, Agent, or Firm* — Cooley LLP

(57) ABSTRACT

A non-transitory processor-readable medium includes code to cause a processor to receive aerial data having a plurality of points arranged in a pattern. An indication associated with each point is provided as an input to a machine learning model to classify each point into a category from a plurality of categories. For each point, a set of points (1) adjacent to that point and (2) having a common category is identified to define a shape from a plurality of shapes. A polyline boundary of each shape is defined by analyzing with respect to a criterion, a position of each point associated with a border of that shape relative to at least one other point. A layer for each category including each shape associated with that category
(Continued)

is defined and a computer-aided design file is generated using the polyline boundary of each shape and the layer for each category.

23 Claims, 7 Drawing Sheets

Related U.S. Application Data

(60) Provisional application No. 62/580,933, filed on Nov. 2, 2017.

(51) Int. Cl.
  *G06K 9/62* (2022.01)
  *G06K 9/00* (2022.01)
  *G06T 3/40* (2006.01)
  *G06V 20/13* (2022.01)
(52) U.S. Cl.
  CPC .......... *G06V 20/13* (2022.01); *G06T 2200/32* (2013.01); *G06T 2207/10032* (2013.01)
(58) Field of Classification Search
  CPC ...... G06N 7/005; G06N 20/20; G06N 3/0454; G06N 3/08; G06T 3/4038; G06T 2200/32; G06T 2207/10032; G06V 20/13; G01C 11/04
  See application file for complete search history.

(56) References Cited

U.S. PATENT DOCUMENTS

| | | | |
|---|---|---|---|
| 10,719,641 | B2 | 7/2020 | Morczinek et al. |
| 2002/0059042 | A1 | 5/2002 | Kacyra et al. |
| 2013/0259390 | A1 | 10/2013 | Dunlop et al. |
| 2015/0006117 | A1 | 1/2015 | Zhang et al. |
| 2015/0117712 | A1 | 4/2015 | Eilat |
| 2017/0083772 | A1 | 3/2017 | Kim et al. |
| 2019/0155973 | A1 | 5/2019 | Morczinek et al. |
| 2019/0164290 | A1 | 5/2019 | Wang et al. |

OTHER PUBLICATIONS

Arefi et al., "Approximation of building boundaries" Urban and Regional Data Management—Coors, Rumor, Fendel & Zlatanova (eds.), (2008) retrieved from https://www.taylorfrancis.com/books/e/9780429224096/chapters/10.4324/9780203931042-4.
Awrangjeb et al., "Automatic Building Footprint Extraction and Regularisation from LIDAR Point Cloud Data," IEEE, 2014, 8 pages.
Barrow et al., "Relational Descriptions in Picture Processing" Machine intelligence, vol. 6, retrieved from STIC. (Year: 1971).
DeCost et al., "A computer vision approach for automated analysis and classification of microstructural image data," Computational Materials Science 110 (2015) 126-133.
DroneDeploy, "What Are Ground Control Points (GCPs) and How Do I Use Them?" May 9, 2017, 6 pages, Retrieved from: https://blog.dronedeploy.com/what-are-ground-control-points-gcps-and-how-do-i-use-them-4f4c3771fd0b.
Farabet et al., "Scene Parsing with Multiscale Feature Learning, Purity Trees, and Optimal Covers," 29th International Conference on Machine Learning (ICML 2012), retrieved from https://arxiv.org/abs/1202.2160.
Fu et al., "Integrating Low-level and Semantic Features for Object Consistent Segmentation," IEEE, 2011 Sixth International Conference on Image and Graphics, pp. 39-44.
Golovinskiy et al., "Shape-based Recognition of 3D Point Clouds in Urban Environments," International Conference on Computer Vision (ICCV), (2009) retrieved from https://gfx.cs.princeton.edu/pubs/Golovinskiy_2009_SRO/paper.pdf.
He et al., "Multi-label Pixelwise Classification for Reconstruction of Large-scale Urban Areas," Journal of Latex Class Files, Jan. 2007, vol. 6, No. 1, pp. 1-9.
Lafarge et al., "Creating large-scale city models from 3D-point clouds: a robust approach with hybrid representation," International Journal of Computer Vision, Springer Verlag, 2012, 99(1), pp. 69-85. <hal-00759265>.
Liu et al. "Building Extraction from High Resolution Satellite Imagery Based on Multi-scale Image Segmentation and Model Matching" 2008 International Workshop on Earth Observation and Remote Sensing Applications (2008), retrieved from https://ieeexplore.ieee.org/document/4620321.
Munoz et al., "Stacked Hierarchical Labeling," ECCV 2010: Computer Vision—ECCV 2010, pp. 57-70, retrieved from https://www.ri.cmu.edu/pub_files/2010/9/munoz_eccv_10.pdf.
Stassopoulou et al., "Building Detection using Bayesian Networks," International Journal of Pattern Recognition and Artificial Intelligence, (2000), vol. 14, No. 6, pp. 715-733, retrieved from https://pdfs.semanticscholar.org/8a85/ee4fd675ee9e4df2b07ce0f1a46ce3b50232.pdf.
Suzuki et al., "Topological Structural Analysis of Digitized Binary Images by Border Following," Computer Vision, Graphics, and Image Processing, (1985) vol. 30, pp. 32-46, retrieved from http://www.academia.edu/download/38698235/suzuki 1985.pdf.
Tang et al., "Automatic reconstruction of as-built building information models from laser-scanned point clouds: A review of related techniques," Automation in Construction, (2010) 19: 829-843.
Venkateshkumar et al., "Latent Hierarchical Part Based Models for Road Scene Understanding," IEEE, 2015 IEEE International Conference on Computer Vision Workshop, pp. 115-123.
Wang et al., "Automatic BIM component extraction from point clouds of existing buildings for sustainability applications," Automation in Construction, 2013, vol. 56, pp. 1-13.
Wu et al., "An Optimal Graph Theoretic Approach to Data Clustering: Theory and Its Application to Image Segmentation," IEEE Transactions on Pattern Analysis and Machine Intelligence, Nov. 1993, vol. 15, No. 11, pp. 1101-1113.
Xu et al., "Classify 3D Voxel based Point-cloud using Convolutional Neural Network on a Neural Compute Stick," IEEE, 2017 13th International Conference on Natural Computation, Fuzzy Systems and Knowledge Discovery (ICNC-FSKD 2017), pp. 37-43.
Extended European Search Report for European Application No. 18772755.6 dated May 28, 2021.
Examination Report for Indian Application No. 202017023043, dated Mar. 25, 2022.
Hackel et al., "Contour detection in unstructured 3D point clouds," IEEE, 2016 IEEE Conference on Computer Vision and Pattern Recognition, pp. 1610-1618.
Najafi et al., "Non-associative Higher-Order Markov Networks for Point Cloud Classification," ECCV 2014, Part V, LNCS 8693, pp. 500-515, 2014.
Yousefhussien et al., "A Fully Convolutional Network for Semantic Labeling of 3D Point Clouds," Arxiv.org, Cornell University Library, Oct. 5, 2017, 17 pages.
European Office Action for European Application No. 18872755.6 dated Nov. 24, 2022, 5 pages.
Australian Office Action for Australian Application No. 20180360836 dated Nov. 4, 2022, 5 pages.

US 11,599,689 B2

METHODS AND APPARATUS FOR AUTOMATICALLY DEFINING COMPUTER-AIDED DESIGN FILES USING MACHINE LEARNING, IMAGE ANALYTICS, AND/OR COMPUTER VISION

CROSS-REFERENCE TO RELATED APPLICATIONS

This application is a continuation of U.S. patent application Ser. No. 16/179,401 entitled "Methods and Apparatus for Automatically Defining Computer-Aided Design Files Using Machine Learning, Image Analytics, and/or Computer Vision," filed Nov. 2, 2018, now U.S. Pat. No. 10,719,641, which claims priority to and the benefit of U.S. Provisional Patent Application Ser. No. 62/580,933 entitled "System and Method for Converting Segmented Aerial Images Automatically into Construction Site Plans and Architecture Drawings and Models with Building and Street Information," filed Nov. 2, 2017, the disclosures of which are incorporated herein by reference in their entireties.

BACKGROUND

The embodiments and methods described herein relate generally to defining and/or creating computer-aided design files, and more particularly, to automatically defining computer-aided design files using machine learning, image analytics, and/or computer vision.

Modern increases in the capabilities of electronic devices have resulted in many tasks performed traditionally by humans being performed, at least in part, by machines. For example, using computer-aided design (CAD), a computer can be used to create, draw, and/or analyze a model, design, and/or drawing. More particularly, CAD software can be used to produce a two-dimensional (2D) or three-dimensional (3D) model that can include and/or present any suitable information such as particular views of the model, units of measure and/or scale, tolerances, material properties, manufacturing and/or construction conventions and/or instructions, machine instructions such as computer numerical control (CNC) instructions or code (e.g., g-code), and/or any other suitable information. In many instances, computer-aid design (CAD) has replaced manual drafting of architectural drawings, engineering drawings, blueprints, and/or other technical documents traditionally performed by a human (e.g., using pen and paper).

In some instances, CAD can be used to model one or more features of a property, a plot of land, and/or a site of interest. The model can include information associated with geological features, topography, and/or buildings, roads, and/or other manmade structures on the land. In some known instances, detailed measurements can be taken of at least a portion of the land and used as input into a CAD program to produce a 2D or 3D model (e.g., a site plan, a site survey, and/or the like) of at least the portion of the land. Likewise, architects, engineers, builders, contractors, etc. can similarly create and/or define 2D and/or 3D CAD models and/or drawings of structures built on the land or future structures not yet physically built. While creating and/or defining such models and/or designs has resulted in increased efficiency compared to drafting and/or drawing done by humans using, for example, pen and paper, some known processes of creating and/or defining these models and/or drawings are still time consuming, labor intensive, and/or expensive. In addition, some such processes can use relatively large amounts of computing resources to generate the 2D and/or 3D CAD models as well as relatively large amounts of computing resources to view and/or otherwise use the generated 2D and/or 3D CAD models in a CAD program.

Accordingly, a need exists for automatically defining computer-aided design files using machine learning, image analytics, and/or computer vision.

SUMMARY

Methods and apparatus for automatically defining computer-aided design files using machine learning, image analytics, and/or computer vision are described herein. In some embodiments, a non-transitory processor-readable medium includes code to cause a processor to receive aerial data having multiple data points arranged in a pattern. The processor provides an indication associated with each point as an input to a machine learning model to classify each point into a category from multiple categories. For each point, the processor is caused to identify a set of points adjacent to that point in the pattern and having a common category of that point to define a shape from multiple shapes. The processor defines a polyline boundary of each shape by analyzing with respect to a criterion a position of each point associated with a border of that shape relative to at least one other point associated with the border of that shape. The processor defines a layer for each category, which includes each shape associated with that category. The processor generates a computer-aided design file using the polyline boundary of each shape and the layer for each category.

DETAILED DESCRIPTION

Figure 1:
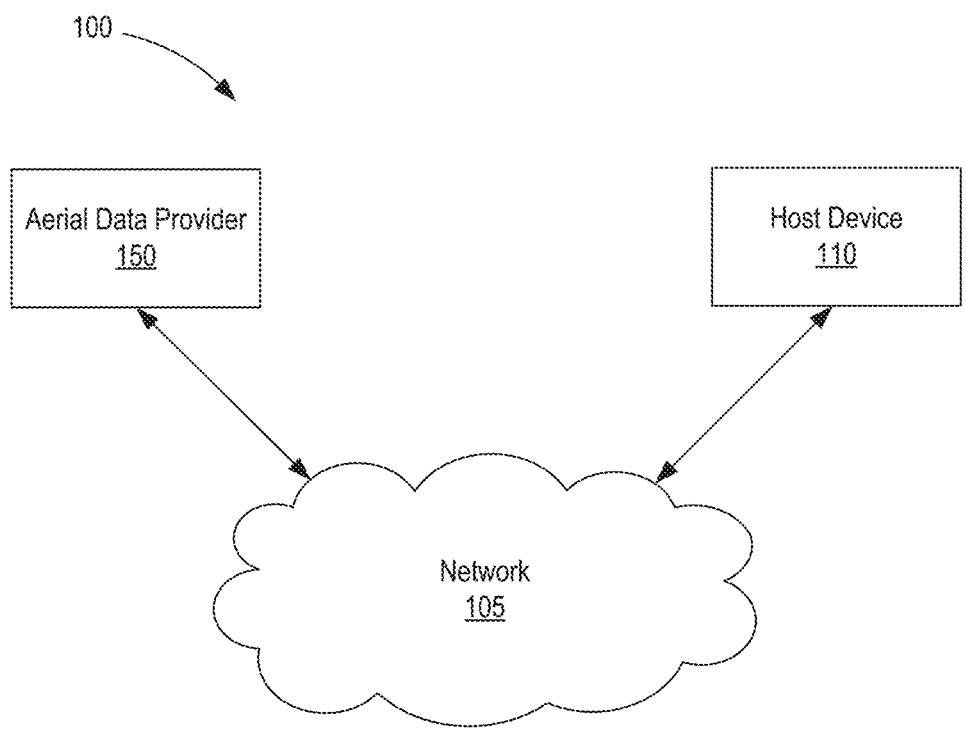
FIG. 1 is a schematic illustration of a system for automatically creating and/or defining computer-aided design files using machine learning, according to an embodiment.

The embodiments and/or methods described herein relate generally to the creation and/or generation of computer-aided design (CAD) files that provide and/or are capable of providing one or more models and/or drawings of a property or other site of interest. The CAD files are generated automatically from image data captured and/or taken of the property or site of interest. The models and/or drawings included in the CAD files can be an accurate two-dimensional (2D) or three-dimensional (3D) digital representation(s) of one or more site plans, site surveys, architectural drawings or models of buildings, etc. Accordingly, the models and/or drawings in the CAD files can provide information associated with the geology and/or topography of the land and/or information associated with the buildings, roads, sidewalks, drainage, plumbing, electrical grid, and/or other manmade structures disposed on or in the property and/or site of interest.

In some instances, it may be desirable to have data associated with the site of interest (represented as one or more 2D or 3D models) in the format of one or more CAD files generated via the systems and/or methods described herein over the format of one or more images (e.g., photographs) of the site of interest for any number of reasons. A non-exhaustive list of some such reasons can include, for example, a greater quantity and/or quality of data associated with the object(s) in the CAD models relative to the quantity and/or quality of data associated with corresponding object(s) in the images; a greater ease of accessing the data associated with the object(s) in the CAD models relative to an ease of accessing the data associated with the corresponding object(s) in the images; an ability to move, change, revise, update, and/or otherwise modify the object(s) in the CAD models, which it not easily performed in the corresponding images; and/or the like. In addition, the images of the site of interest can be relatively large files that use a relatively large amount of computing resources when a computing device presents the images of the site of interest on a display of the computing device. In some instances, CAD files generated via the systems and/or methods described herein can present a greater quantity and/or quality of data relative to the corresponding images while a size of the CAD files can be smaller (e.g., compressed) and/or an amount of computing resources used can be less than that of the corresponding images (e.g., the computing device executing the CAD programs and the CAD files can operate more efficiently and/or with greater performance). In addition, CAD files generated via the systems and/or methods described herein can be more accurate and/or less prone to human error compared to known methods of a human converting (e.g., tracing) the images of the site of interest into the corresponding 2D and/or 3D models of the site of interest included in the CAD files.

In some instances, a host device can be configured to create and/or define one or more CAD files based at least in part on aerial data (e.g., images, plots, scans, point clouds, etc.) received from an aerial data provider. The aerial data provider can be any suitable device capable of capturing aerial data and/or any suitable device, database, and/or repository configured to store aerial data. After receiving the aerial data, the host device can analyze the aerial data, can identify and categorize one or more shapes represented by at least a portion of the data, and can generate a CAD file that models, draws, and/or depicts the one or more shapes. In some instances, the identification and/or categorization of the one or more shapes can be performed by and/or can be an output of one or more machine learning models. In addition, the aerial data and/or the results of analyzing the aerial data can be provided as an input to the machine learning model for the purposes of training, for example, to increase the accuracy and/or efficiency of the identification and/or categorization of the one or more shapes. Accordingly, the embodiments and/or methods described herein can be used to automatically define CAD files using machine learning, image analytics, and/or computer vision, as described in further detail herein.

As described in further detail herein, the host device can be configured to process the aerial data according to one or more predetermined and/or desired rules and/or methods. In some instances, the host device can be configured to execute a set of processes, rules, and/or instruction associated with segmenting an image (e.g., photograph or photogrammetry data) to identifying one or more shapes included in that image (e.g., via machine learning). The host device can then execute a set of processes, rules, and/or instructions associated with classifying the identified shapes into one or more categories that correspond to one or more desired layers to be included and/or defined in a CAD file. The host device can then execute a set of processes, rules, and/or instructions associated with converting the borders of each shape in the image (e.g., in a first format) into a polyline boundary of that shape (e.g., in a second format). In some instances, the host device can be configured to analyze the polyline boundaries to generate a smoothed, simplified, and/or filtered polyline boundary according to one or more thresholds, criteria(ion), and/or rules. The host device can then generate a CAD file that includes shapes having smoothed and/or simplified polyline boundaries (e.g., shapes in the second format) that correspond to the shapes shown in the original image (e.g., shapes in the first format).

In some embodiments, a non-transitory processor-readable medium includes code to cause a processor to receive aerial data having multiple points arranged in a pattern. The processor provides an indication associated with each point as an input to a machine learning model to classify each point into a category from multiple categories. For each point, the processor is caused to identify a set of points adjacent to that point in the pattern and having a common category of that point to define a shape from multiple shapes. The processor defines a polyline boundary of each shape by analyzing with respect to a criterion a position of each point associated with a border of that shape relative to at least one other point associated with the border of that shape. The processor defines a layer for each category, which includes each shape associated with that category. The processor generates a computer-aided design file using the polyline boundary of each shape and the layer for each category.

In some embodiments, an apparatus includes a memory and a processor operatively coupled to the memory. The processor is configured to receive aerial data having multiple points arranged in a pattern. The processor is configured to provide an indication associated with each point as an input to a machine learning model to classify each point into a set of categories from multiple categories. The processor is configured to select a category for each point based on a predefined category hierarchy. For each point, the processor is configured to identify a set of points (1) adjacent to that point in the pattern and (2) having a common category to define a shape from a multiple of shapes. The processor is configured to generate a computer-aided design file using each shape from the multiple of shapes.

In some embodiments, a method includes training, at a first time, a machine learning model using a first aerial dataset having a first set of shapes. Each shape (1) is labeled with a category from a multitude of categories and (2) includes a polyline boundary fully encompassing that shape and distinct from the polyline boundary for the remaining shapes. At a second time after the first time, a second aerial dataset having multiple points arranged in a pattern is received. An indication associated with each point as an input to the machine learning model to classify each point into a category. For each point, a set of points (1) adjacent to that point in the pattern and (2) having a common category is identified to define a shape from a second set of shapes. A polyline boundary of each shape from the second set of shapes is defined by analyzing with respect to a criterion a position of each point associated with a border of that shape relative to at least one other point associated with the border of that shape. A computer-aided design file is defined using the polyline boundary of each shape from the second set of shapes.

In some embodiments, a non-transitory processor-readable medium includes code to cause a processor to receive aerial data having multiple points arranged in a pattern. The processor filters the aerial data to define a set of points from the multiple points. For each point from the set of points, the processor identifies a group of points adjacent to that point in the pattern to define a cluster from a multitude of clusters. The processor defines a set of clusters based on at least one of a number of points in each cluster or each point in each cluster meeting an elevation criterion. The processor defines a shape from a set of shapes formed by at least one cluster from the set of clusters based at least in part on the at least one cluster meeting a regularity criterion. The processor generates a polyline boundary of each shape by analyzing with respect to a criterion a position of each point associated with a border of that shape relative to at least one other point associated with the border of that shape and generates a computer-aided design file using the polyline boundary of each cluster.

As used in this specification, the singular forms "a," "an," and "the" include plural referents unless the context clearly dictates otherwise. Thus, for example, the term "an image" is intended to mean a single image or a combination of images, "a model" is intended to mean one or more models, or a combination thereof.

The embodiments described herein are configured to process one or more images and/or one or more sets of data points to generate a computer-aided design (CAD) file associated with and/or modeling the one or more images and/or the one or more sets of data points. In general, digital images can be stored in a memory of a computing device as either a raster image or a vector image. For both types of images, a set of data points are arranged in a specific pattern to define and/or create the image. For a raster image, each data point is represented as a pixel, which is generally assigned a value or set of values indicating, for example, a color of that pixel in the red, green, blue (RGB) color system and/or any other suitable data associated with and/or embedded in that pixel. In some instances, each data point can also include location data for that point relative to a desired reference (e.g., a reference coordinate system, an absolute coordinate system, a surface of the Earth, and/or any other suitable reference), as described in further detail herein. For a vector image, each data point has a defined position in a known coordinate system and determines the direction of a path (e.g., a polyline, a curved polyline, a Bézier curve, etc.) connecting two or more data points. In other words, a vector image is a graphic representation of instructions that cause a processor to draw one or more lines in a known or desired manner between two or more data points.

As used herein, the phrase "site of interest" generally refers to any suitable property, improved or unimproved plot of land, construction site or planned construction site, and/or any other portion of the Earth's surface that is of interest to an interested party.

As used herein, the term "aerial data" generally refers to any suitable data associated with a site of interest and captured, scanned, recorded, collected, and/or taken from the perspective of an aerial viewpoint relative to the site of interest. In some instances, aerial data can include any suitable number of aerial images (e.g., photographs) of the site of interest (or a portion thereof). In the case of multiple aerial images, the aerial images of the site of interest can have, for example, a relatively large amount of overlay and/or overlap and can each be taken from substantially the same altitude.

In some instances, "aerial data" can be data from and/or data included in one or more orthomosaic images. An orthomosaic image can be, for example, one or more aerial images (e.g., photographs of at least a portion of the site of interest) that have been geometrically corrected (known as "orthorectified") to be an accurate representation of the Earth's surface shown in the aerial image. In addition, the orthomosaic images can be georeferenced such that the images contain coordinates and/or a coordinate system allowing the orthomosaic images to represent the true location of the image on the Earth's surface (e.g., within a predetermined tolerance). In some instances, the georeferenced orthomosaic images can be converted into and/or saved as a "geotiff" (an open source standard allowing data resulting from coordinate transformations associated with a georeferencing process to be embedded within a TIFF file). Although a specific example of a method and/or process of producing orthomosaic and/or georeferenced image is described above, it should be understood that the method and/or process is presented by way of example only and not limitation. Accordingly, it should be understood that other methods, formats, and/or standards of georeferencing images are possible.

In some instances, "aerial data" can be data from and/or data included in a point cloud (e.g., a set of data points in space). For example, in some instances, any suitable photogrammetry processes and/or techniques can be used to capture and/or obtain images of a site of interest (e.g., generally taken from an aerial position), which then can be analyzed to generate a set of data points (e.g., a point cloud) that can model, for example, the topography of the site of interest. As described above with reference to the orthomosaic images, each point in the point cloud (e.g., the resulting data points generated through photogrammetry) can be georeferenced allowing the point cloud to represent the true location of the point cloud on the Earth's surface (within a predetermined tolerance). In addition to being georeferenced, each point in the point cloud can also include data indicative of an elevation of that point. In some instances, the elevation data can indicate whether the data point is a ground level data point or a non-ground level data point. As such, the data points can represent a 3D surface representing an overlay of the Earth's surface at the site of interest including data points indicative of a ground surface, plants, trees, bodies of water, sidewalks, roads, bridges, buildings, etc.

In some instances, a point cloud can be a data set that results from combining data generated via photogrammetric methods and/or analysis and data generated via any number of additional methods, scans, and/or analytic methods or techniques. For example, in some instances, photogrammetric data can be combined with range data (e.g., generated via a LiDAR scan and/or a scan from any other suitable device generally taken from an aerial position) to generate a set of 3D data points. In some instances, the use of data sets captured and/or generated via multiple modes can allow for verification of position data and/or enhancement of position data (e.g., increases in accuracy compared to using a single mode). In other instances, a point cloud can be generated using methods and/or modes other than photogrammetry. For example, in some instances, a point cloud can include data generated by a LiDAR scan without additional photogrammetric data. Although a specific method and/or process of producing a point cloud is described above, it should be understood that the method and/or process is presented by way of example only and not limitation. Accordingly, it should be understood that other methods, formats, and/or standards associated with acquiring and/or using point cloud data are possible.

In some instances, aerial data or a portion thereof can be raw data taken from a camera, scanner, emitter, sensor, etc. In other instances, the aerial data or a portion thereof can be data that is derived and/or calculated from one or more datasets. While examples of aerial data are provided above, it should be understood that aerial data can be and/or can include any other suitable data associated with the site of interest (e.g., any suitable aerial data in addition to orthomosaic images and/or point clouds and/or any suitable non-aerial data).

FIG. 1 is a schematic illustration of a system 100 for automatically defining CAD files. The system 100 includes at least a host device 110 and an aerial data provider 150 in communication via a network. As described in further detail herein, in some implementations, the system 100 can be used to create and/or define one or more CAD files containing data associated with one or more 2D or 3D models and/or drawings of a property or other site of interest. In some implementations, the host device 110 can be configured to receive aerial data from the aerial data provider 150 via the network 105. In turn, the host device 110 can use the aerial data to generate and/or define models and/or drawings such as, for example, one or more site plans, site surveys, and/or any other suitable model, drawing, etc. of one or more features associated with the site of interest.

The network 105 can be, for example, a local area network (LAN), a wide area network (WAN), a metropolitan area network (MAN), a worldwide interoperability for microwave access network (WiMAX), a telephone network (such as the Public Switched Telephone Network (PSTN) and/or a Public Land Mobile Network (PLMN)), an intranet, the Internet, an optical fiber (or fiber optic)-based network, a virtual network, a cellular network, and/or any other suitable network. Moreover, the network 105 can be implemented as a wired and/or wireless network. In some implementations, the network 105 can include one or more networks of any type such as, for example, a wired or wireless LAN and the Internet.

Figure 2:
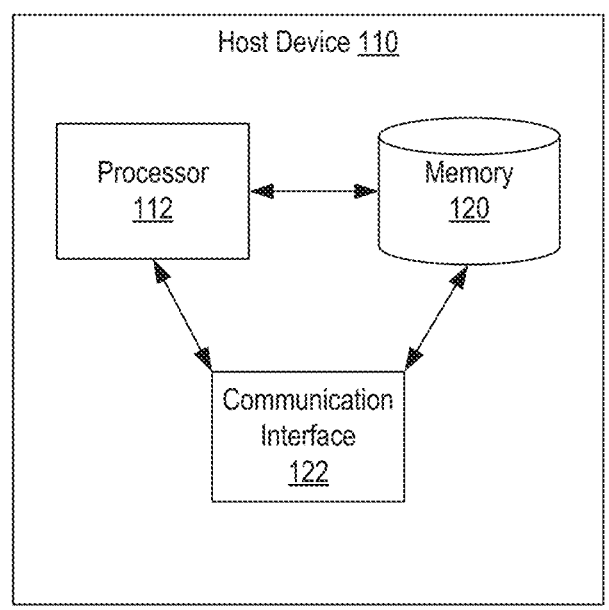
FIG. 2 is schematic illustration of a host device included in the system of FIG. 1.

The host device 110 can be any suitable hardware-based computing device. For example, in some embodiments, the host device 110 can be, for example, a smart phone, a tablet, a laptop, a personal computer (PC), a server device, a workstation, and/or the like. As shown in FIG. 2, the host device 110 can include at least a memory 120, a processor 112, and a communication interface 122.

The memory 120 of the host device 110 can be, for example, a random access memory (RAM), a memory buffer, a hard drive, a read-only memory (ROM), an erasable programmable read-only memory (EPROM), and/or the like. The memory 120 can be configured to store, for example, one or more software modules and/or code that can include instructions that can cause the processor 112 to perform one or more processes, functions, and/or the like (e.g., processes, functions, etc. associated with generating CAD files based on aerial data). In some implementations, the memory 120 can be physically housed and/or contained in or by the host device 110. In other implementations, the memory 120 and/or at least a portion thereof can be operatively coupled to the host device 110 and/or at least the processor 112. In such implementations, the memory 120 can be, for example, included in and/or distributed across one or more devices such as, for example, server devices, cloud-based computing devices, network computing devices, and/or the like. Moreover, the memory 120 and/or at least a portion thereof can include and/or can be in communication with one or more data storage structures such as, for example, one or more databases and/or the like, as described in further detail herein.

The processor 112 can be a hardware-based integrated circuit (IC) and/or any other suitable processing device configured to run or execute a set of instructions and/or code stored, for example, in the memory 120. For example, the processor 112 can be a general purpose processor, a central processing unit (CPU), an accelerated processing unit (APU), an application specific integrated circuit (ASIC), a network processor, a front end processor, a field programmable gate array (FPGA), a programmable logic array (PLA), and/or the like. The processor 112 can be in communication with the memory 120 via any suitable interconnection, system bus, circuit, and/or the like. As described in further detail herein, the processor 112 can include any number of engines, processing units, cores, etc. configured to execute code, instructions, modules, processes, and/or functions associated with generating CAD files of a site of interest based on, for example, aerial data of the site.

The communication interface 122 can be any suitable hardware-based device in communication with the processor 112 and the memory 120 and/or any suitable software stored in the memory 120 and executed by the processor 112. In some implementations, the communication interface 122 can be configured to communicate with the network 105 (e.g., any suitable device in communication with the network 105). The communication interface 122 can include one or more wired and/or wireless interfaces, such as, for example, a network interface card (NIC). In some implementations, the NIC can include, for example, one or more Ethernet interfaces, optical carrier (OC) interfaces, and/or asynchronous transfer mode (ATM) interfaces, one or more wireless radios (e.g., a WiFi® radio, a Bluetooth® radio, etc.). As described in further detail herein, in some implementations, the communication interface 122 can be configured to receive aerial data from the aerial data provider 150 and can be configured to transmit and/or deliver the aerial data to the memory 120 for storage and/or the processor 112 for processing.

The aerial data provider 150 can be any suitable device or set of devices and/or any suitable service configured to provide aerial data of and/or associated with a site of interest. For example, the aerial data can be any of the examples of aerial data provided above. Similarly, the site of interest can be any of the examples of a site of interest provided above. In some implementations, the aerial data provider 150 can be any suitable device capable of capturing aerial data such as a camera, video recorder, or imaging device, a surveying device (e.g., a LiDAR device, infrared camera, radiation detector, frequency analyzer, and/or any other suitable multispectral data), a scanner, and/or the like. In addition, the device and/or devices can be positioned directly or indirectly above the site of interest by being coupled to, included in, and/or otherwise carried by, for example, a remote operated drone, an unmanned aerial vehicle (UAV) having any suitable degree of autonomy, a piloted aerial vehicle (e.g., an airplane, helicopter, etc.), a satellite, and/or any other aerial or flying or orbiting vehicle, device, or machine. As one example, the aerial data provider 150 can be a remotely operated drone that (1) includes one or more cameras, video recorders, LiDAR devices, sensors, computing devices, and/or the like; (2) is controlled by a remote controller operated, for example, by a user; and (3) is in communication with the network 105 or otherwise capable of communicating with the network 105 via a wired or wireless connection.

In other implementations, the aerial data provider 150 can be a device or a service that can store (e.g., in a database) and/or archive captured aerial data and that can provide aerial data on request. For example, the database can be, for example, a table, a repository, a relational database, an object-oriented database, an object-relational database, a structured query language (SQL) database, an extensible markup language (XML) database, and/or the like. In some such implementations, the host device 110 can send a request and/or can query a database storing aerial data associated with a site of interest. In some embodiments, such a database can be included in the system 100 and/or can be included in the host device 110 (e.g., as part of the memory 120). In other embodiments, such a database can be a third-party database to which access is selectively granted based on a service agreement and/or the like.

Figure 3:
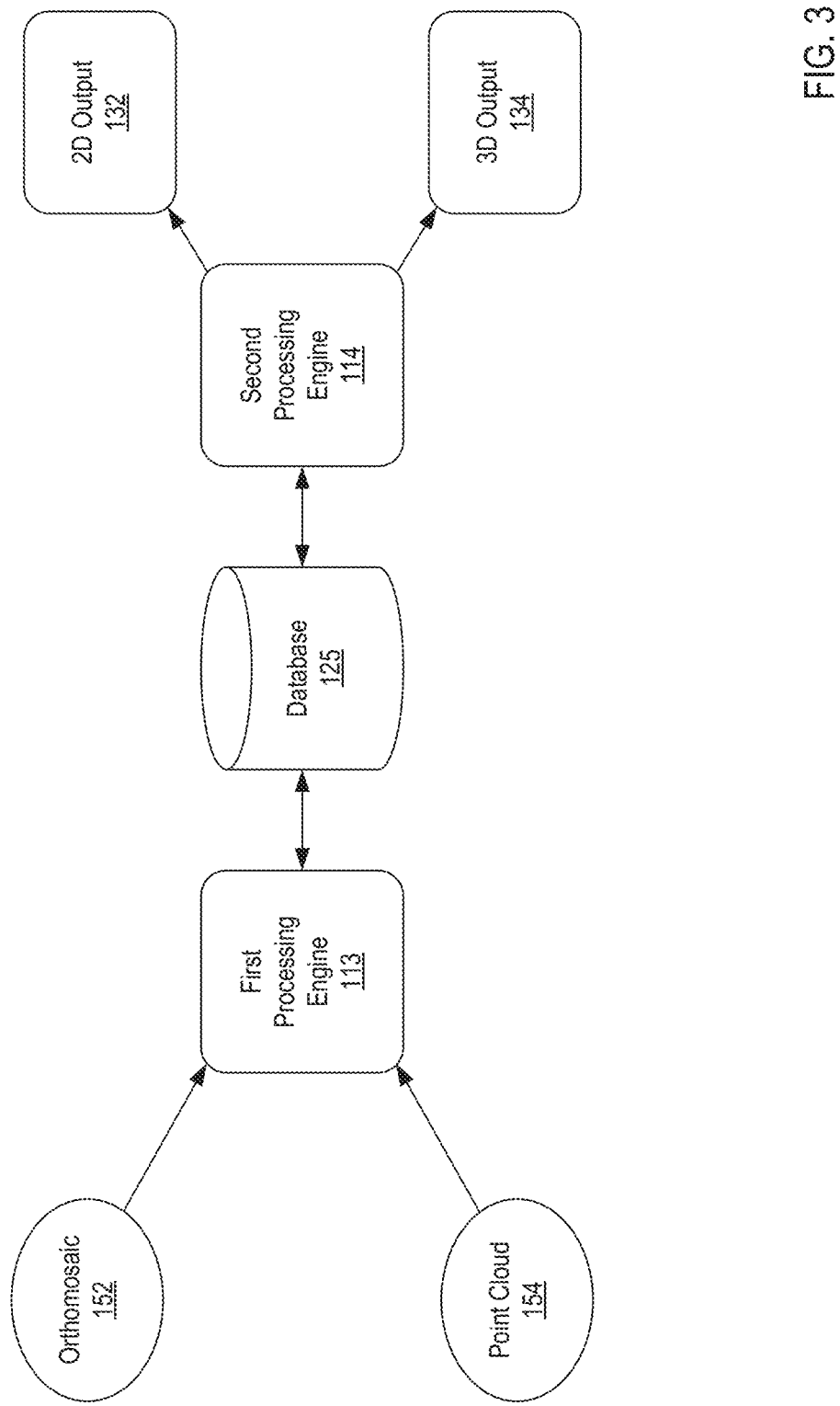
FIG. 3 is system block diagram illustrating a process of using the system of FIG. 1 to automatically create and/or define computer-aided design files.

As described above, the host device 110 is configured to receive aerial data from the aerial data provider 150 via, for example, the network 105. More specifically, the processor 112 of the host device 110 can include a first processing engine 113 and a second processing engine 114, as shown in FIG. 3. The first processing engine 113 and the second processing engine 114 can be any suitable combination of hardware and/or software (stored in memory 120 and executed by processor 112). In some implementations, the first processing engine 113 can be a first portion of the processor 112 and the second processing engine 114 can be a second portion of the processor 112 discrete from the first portion. In other implementations, the first processing engine 113 and the second processing engine 114 can use any suitable combination of resources, processing units, integrated circuits, and/or the like. As described in further detail herein, the first processing engine 113 can be configured to receive aerial data in the form of, for example, an orthomosaic image 152 of the site of interest and/or a point cloud 154 of the site of interest.

Figure 4:
FIG. 4 is an example of an aerial image, which can be used by the system of FIG. 1 to automatically create and/or define computer-aided design files.

Although not shown in FIG. 3, in some implementations, the aerial data provider 150, the host device 110, and/or any other suitable computing device included in the system 100 can be configured to convert one or more aerial images of the site of interest into, for example, one or more of the orthomosaic images 152. FIG. 4 shows an example of an aerial image 151 of a site of interest taken at 400 feet, prior to being orthorectified (e.g., the process of correcting the aerial image to result in an orthomosaic image).

In some instances, multiple aerial images of the site of interest can be captured such that a resulting orthomosaic image (e.g., the orthomosaic image 152) has a desired resolution. Moreover, the aerial images can be captured by a device that is disposed at a height or elevation (e.g., measured as an altitude above ground level (AGL), an elevation above mean sea level (ASML), and/or the like) based at least in part on a resolution of the device capturing the image (e.g., a camera), a focal length of the device, a flight altitude, and/or the like. For example, as used herein, a "ground sample distance" (GSD) can refer to a distance between two points on the ground that correspond to the center of two adjacent pixels in an image of the ground. Accordingly, GSD can be used to refer to a characteristic and/or limitation to image resolution and expressed as a distance (on the ground) per pixel (in an image of the ground). In some instances, an AGL of a device capturing an image of a site can be based on a desired GSD of the images captured and thus, can result in a desired resolution of the orthomosaic image 152. For example, in some instances, multiple aerial images can be captured at an AGL of 150 feet (ft.) and can have a GSD of about 0.5 inches (in.) per pixel. Moreover, the multiple aerial images can be captured in sequence such that an aerial image overlaps an immediately preceding aerial image by up to about 85% or more and an aerial image overlaps an adjacent aerial image in a transverse direction by up to about 80% or more. As such, the orthomosaic image 152 can have a desired clarity and/or resolution.

Figure 5:
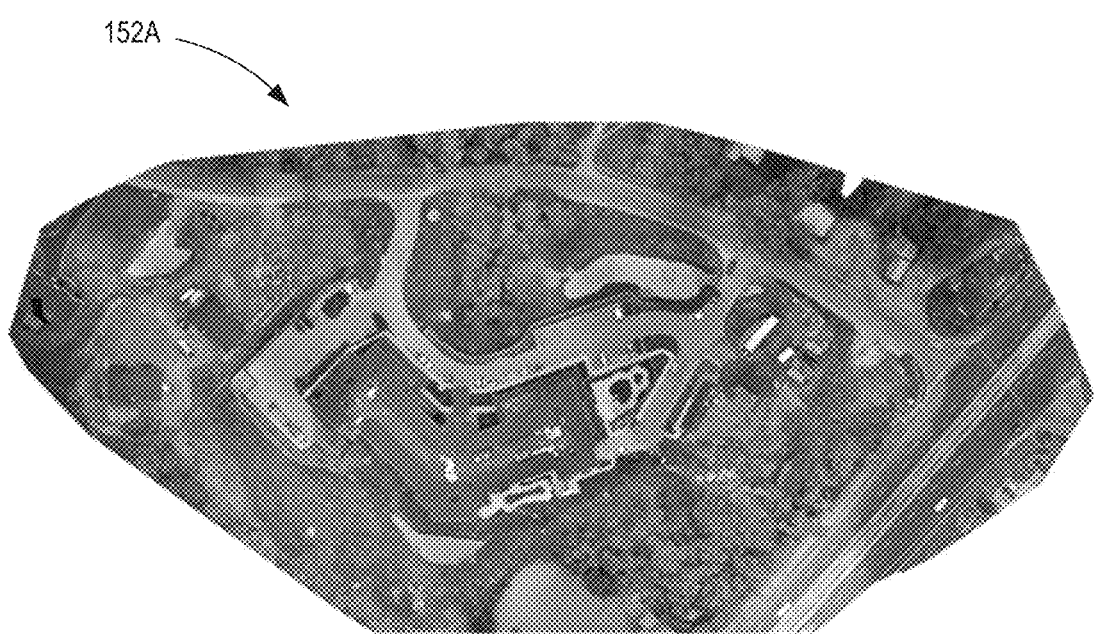
FIG. 5 is an example of an orthomosaic image, which can be used by the system of FIG. 1 to automatically create and/or define computer-aided design files.

FIG. 5 shows an example of an orthomosaic image 152A of a site of interest. As described above, the orthomosaic image 152A of the site of interest can be a result of correcting or adjusting (e.g., orthorectifying) any suitable number of aerial images such that the orthomosaic image 152A accurately represents the true location of the orthomosaic image 152A on the Earth's surface. In some instances, the system 100 can be configured to convert an aerial image (e.g., similar to the aerial image 151 shown in FIG. 4) into an orthomosaic image (e.g., similar to the orthomosaic image 152A shown in FIG. 5) using, for example, available software tools such as but not limited to Pix4D, DroneDeploy, Agisoft, and/or the like. Moreover, any suitable number of ground control points (GCP) and/or any other suitable reference points can be used to verify the location of the orthomosaic image 152A on the Earth's surface. For example, in some instances, a number of 18 in. by 18 in. GCP markers can be placed at desired positions on the site of interest (e.g., at the corners of the site, at the center of the site, at local maxima or local minima elevations, etc.) and the position of each GCP can be determined using a real-time kinematic (RTK) global positioning system (GPS), a total station theodolite (TST), and/or any other suitable surveying tool or combinations thereof. In some instances, the RTK GPS can use, for example, at least 10 satellites, and up to 20 or more satellites, to triangulate the position of the GCP markers with an accuracy of about 0.05 ft. Accordingly, the georeferenced location shown in the orthomosaic image 152 can be verified to a relatively high degree of certainty by correlating the position of the GCP markers on the site (e.g., on the real-world surface of the site) and the position of the GCP markers shown in the orthomosaic image 152. After the aerial image is converted into the orthomosaic image 152 and the accuracy of the georeferenced location of the orthomosaic image 152 is verified, the orthomosaic image can be provided to the first processing engine 113 (e.g., the orthomosaic image 152, as shown in FIG. 3).

Three examples of processing and/or analyzing aerial data are provided below. While the three examples are specifically described, it should be understood that other methods and/or processes for processing and/or analyzing aerial data are possible.

In a first example, the first processing engine 113 can receive the orthomosaic image(s) 152 from, for example, the aerial data provider 150. In some instances, for example, the aerial data can be contained and/or stored in a database configured to store any number of aerial images and/or any suitable aerial data. In other instances, the aerial data can be received from a device capturing the aerial data (e.g., a drone or the like). As described above, the orthomosaic image 152 can be in a geotiff format in which each data point is represented by a pixel, which is generally assigned a value or set of values indicating, for example, an RGB color value of that pixel and/or any other suitable data associated with and/or embedded in that pixel. Moreover, a geotiff is an image that has been georeferenced such that each pixel is a representation of its true location on the Earth's surface (e.g., within a desired tolerance). The geotiff can include data such as, for example, a coordinate system for the orthomosaic image 152, and/or a position of each pixel relative to the coordinate system. Thus, each pixel in the geotiff can include data indicating the pixel's position in the coordinate system (e.g., an X-Y plane) of the geotiff and a value indicative of a color of the pixel (e.g., a RGB value). In response to receiving the orthomosaic image 152, the first processing engine 113 can be configured to analyze the data associated with each pixel to identify one or more features, shapes, objects, etc. (collectively referred to henceforth as "shape" for simplicity) in the orthomosaic image 152; classify, categorize, and/or label each identified shape; and segment the data included in the orthomosaic image according to the classification, categorization, and/or label.

In some implementations, the first processing engine 113 can be and/or can be configured to execute one or more machine learning models to classify, categorize, and/or label (collectively referred to henceforth as "categorize" for simplicity) the orthomosaic image(s) 152. In such implementations, the first processing engine 113 can provide the data associated with each pixel as input into the machine learning model, which in turn, can analyze, identify, and/or categorize the pixels and/or one or more shapes formed by groups or clusters of pixels. More particularly, the data associated with each pixel can be decomposed into any suitable number of variables (e.g., binary variables), which are input into the machine learning model. For example, as described in further detail herein with respect to training, the data can be decomposed into one or more vectors of binary values (i.e., a value of "zero" or a value of "one"). In some instances, such a vector could be defined and/or described as [X,Y,R,G,B], in which X and Y are an X coordinate and a Y coordinate, respectively, and R, G, and B are a red value, green value, and blue value, respectively, in the RGB color system.

The first processing engine 113 can use any suitable machine learning model for generating, improving, and/or optimizing a statistical model using training datasets. Initially, the machine learning model can be seeded with any suitable number of training datasets and after a suitable initialization can be configured to use data included in the orthomosaic image 152 and/or output data resulting from processing the orthomosaic image 152 as one or more training datasets.

In some instances, the machine learning model used, performed, and/or executed by the first processing engine 113 can be generated, improved, trained, and/or optimized using any suitable machine learning tool, implemented in any suitable computational environment, and using any suitable computing language. For example, the implementation can be done in environments such as, for example, Python, TensorFlow, and/or the like. In some implementations, a statistical model can be built, for example, using linear or non-linear space and/or using supervised and/or unsupervised methods. For example, unsupervised approaches can include clustering methods, Independent Component analysis, Matrix Factorization methods, unsupervised neural networks, and/or the like. As another example, supervised methods can include similarity and metric learning methods, supervised neural networks, and/or any other suitable supervised method.

Some known machine learning models implementing neural networks can have multiple different layers, where each layer includes multiple nodes. In some implementations, nodes belonging to different layers have interconnections with other nodes to define a network. This network of multiple nodes can be used to classify images, data, files, documents, and/or the like. Some implementations of neural networks can use one or more hidden layers of computing nodes that can feed forward and/or feedback information. In some instances, a neural network with or without hidden computing layers of neurons can be configured to find informative patterns of feature occurrence through non-linear statistical modeling. Moreover, the use of machine learning tools, including neural networks, can include one or more steps of data pre-processing such as input normalization, which can be used, for example, to stabilize the behavior of the neural network.

In implementations in which the first processing engine 113 is configured to include and/or execute one or more neural networks, the one or more neural networks can have any suitable architecture(s) including, for example, any suitable number of hidden layers, any suitable number of computing units per hidden layer, any suitable number of input and output layers, any suitable interaction between the different layers, any suitable degree of recurrence in the overall network architecture within and across layers, any suitable type(s) of computing units used to generate each layer, any suitable computing capability (e.g., linearity or non-linearity) of each computing unit, any suitable method of handling of feedback, etc.

Figure 6:
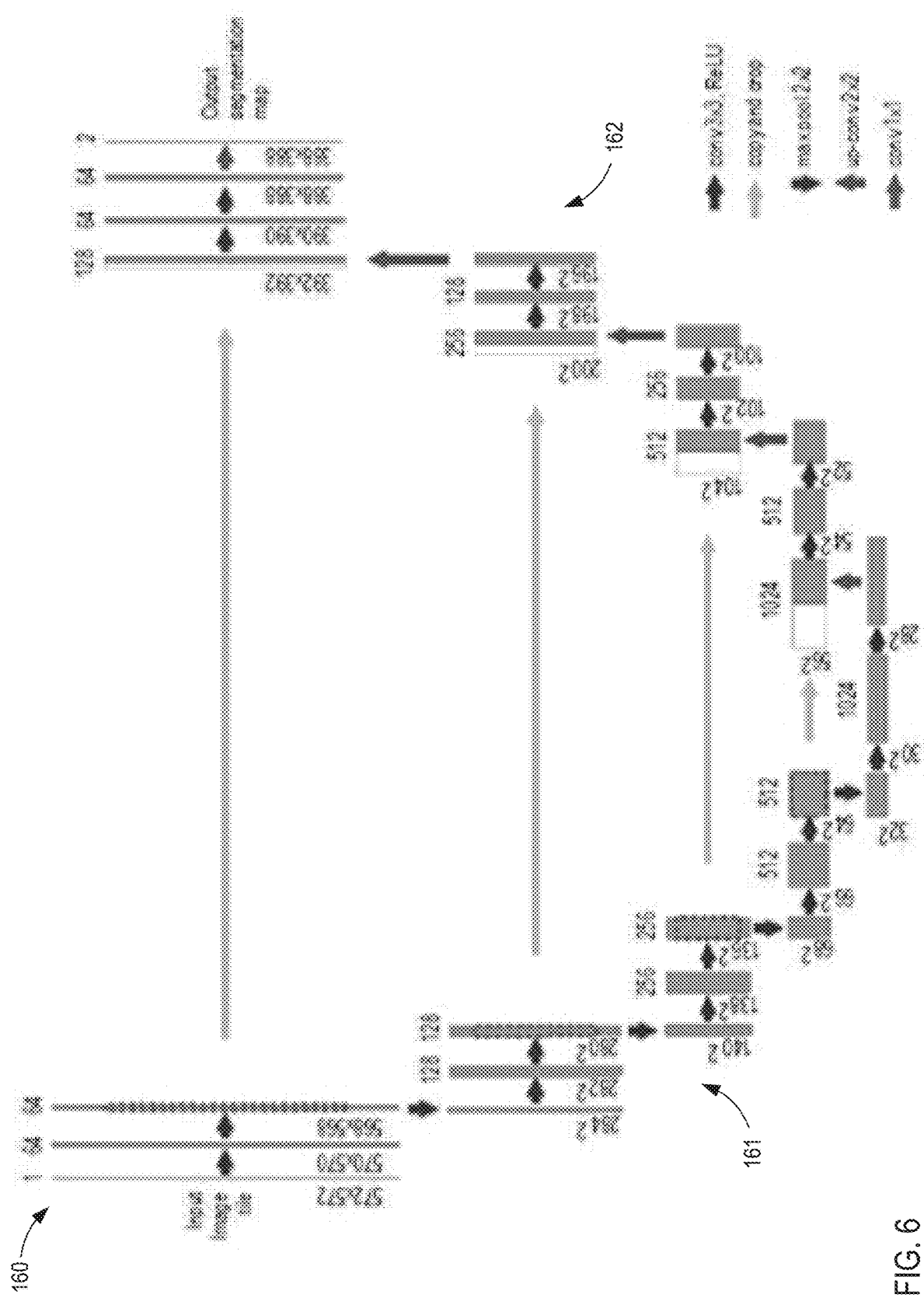
FIG. 6 is a schematic diagram of a U-Net, according to an embodiment.

In some instances, a machine learning model used for computer vision, image segmentation, and/or the like, can include and/or can be based on a convolutional neural network (CNN) architecture. In some implementations, a convolutional neural network can include any number of convolution layers or operations, rectified linear units (ReLU), and max pooling operations to generate a matrix of data, which is then flattened and provided as input into any number of fully connected layers resulting in a final output. Some convolutional neural networks can include contracting paths to capture context of an image and symmetric expanding paths to enable localization of structures. In some implementations, a convolutional neural network can have a "u-net" architecture (or a modified u-net architecture). An example u-net convolutional neural network 160, which can be used in some implementations of the system 100, is shown in FIG. 6. For example, the u-net neural network 160 can be based on a fully convolutional neural network used for semantic segmentation. As shown in FIG. 6, the u-net neural network 160 can include a contracting path 161 having any number of convolutions followed by a ReLU and a max pooling operation, which, in some instances, can reduce spatial information an increase feature information. In addition, the u-net neural network 160 can include an expansive path 162 configured to combine the spatial and feature information as a result of up-convolutions and concatenations.

While an example of a u-net is shown FIG. 6, in some implementations, the first processing engine 113 can use any suitable CNN that has been tuned, modified, and/or customized in any suitable manner to better suit the image segmentation and identification performed by the first processing engine 113. For example, a CNN similar to the u-net 160 can be modified and/or configured as a multi-path refinement network performing semantic segmentation such as, for example, RefineNet. In other implementations, a CNN can be modified and/or otherwise configured to perform any suitable computer vision process, task, method, and/or the like. For example, in some instances, the first processing engine 113 can implement a residual neural network that is based on a CNN architecture but configured to skip over a layer of the network (referred to as "ResNet").

Additional examples of machine learning models that can be used for image segmentation can include residual neural networks that are based on a CNN architecture but configured to skip over multiple layers of the network (referred to as "DenseNet"); fully convolutional DenseNet encoder decoder (FCDED), for example, implementing an encoder network such as a ResNet or DenseNet architecture and a decoder network configured to semantically project discriminative features learned by the encoder onto the pixel level; full resolution residual networks (FRRN), for example, using a ResNet or DenseNet architecture that is implemented at a full resolution level and a pixel level; Pyramid Scene Parsing networks (PSPNet), for example, implementing a ResNet architecture modified to include any number of dilated convolutions; Mobile u-net, for example, implementing a mobile compatible u-net architecture; a decision tree model, for example, using a decision tree to draw conclusions about an item's target value based on observations about that item; a random forest model, for example, using multiple decision trees at training and using classification and/or regression of individual decision trees at output to mitigate overfitting to a given training set; a Bayesian network, for example, using Bayes theorem as a basis to draw inferences from a posterior distribution and likelihood for a given output; a clustering model configured to group similar objects into the same group or cluster and/or the like.

While some specific models and/or methods are described above, it should be understood that the models and/or methods are presented by way of example only and not limitation. For example, in some instances, a machine learning model (e.g., a neural network and/or the like) can be implemented and/or trained using linear or non-linear space and/or using supervised or unsupervised methods. In some instances, the methods used during training can be similar to or different from the methods used during implementation (e.g., the generation of an output rather than training).

As described above, the first processing engine 113 is configured to analyze each data point in the orthomosaic image 152 (e.g., each pixel) to identify a set of shapes in the orthomosaic image 152, to categorize the shape (and/or each point or pixel forming the shape) based on one or more parameters, and to segment the data included in the orthomosaic image 152 according to the categorization. For example, in some implementations, the first processing engine 113 (e.g., via the machine learning model) can identify a set of shapes that correspond to natural or man-made features found on the site of interest. In some implementations, the first processing engine 113 can define each shape based on data associated with each pixel forming the shape (e.g., position, true color, elevation, and/or the like). For example, the first processing engine 113 can classify and/or categorize each pixel (e.g., each data point) and can define a shape by identifying adjacent pixels having the same class or category. In some instances, the detection and/or definition of the shapes contained in the orthomosaic image 152 can be an automated process based on the machine learning model.

In some implementations, the first processing engine 113 can be configured to categorize the data points, pixels, and/or shapes and to segment the data contained in the orthomosaic image 152 based on the categorization. The categorization can be based on any suitable parameter or combination of parameters. As shown in FIG. 3, the first processing engine 113 can be in communication with, for example, a database 125 (e.g., defined by and/or as a part of the memory 120 or separate from the memory 120) configured to store one or more parameters, filters, user preferences, and/or the like.

In some instances, the user can define one or more categories, for example, based on information known to the user about the site. For example, a user may know that a site of interest contains a first portion that is associated with the natural ground surface of the site, a second portion that is associated with a road (e.g., a portion of the natural ground surface that is covered by a road), and a third portion that is associated with a building (e.g., a portion of the natural ground surface on which a building is built). In such instances, the user may define and/or set a first category associated with the natural ground surface, a second category associated with the road, and a third category associated with the building and data associated with each category can be stored, for example, in the database 125. Accordingly, the first processing engine 113 can query the database 125 for the set of categories and/or any other set of instructions, parameters, data, etc. and can then assign each data point, pixel, and/or shape to a category based on data stored in the database 125, based on the output of the machine learning model, and/or based on any other suitable data. In other instances, the one or more categories may be a default set of categories that are not specific to the site and/or the user. The data can then be classified, using the machine learning model, to one or more default categories.

By way of example, the first processing engine 113 may determine that three groupings or clusters of adjacent pixels should be placed in the first category because the portion of the orthomosaic image 152 (e.g., the pixels) contained in a boundary of each grouping and/or cluster depicts the natural ground surface. Similarly, the first processing engine 113 may determine that two groupings or clusters of adjacent pixels should be placed in the second category and one grouping or cluster of adjacent pixels should be placed in the third category. As such, the first processing engine 113 can identify and/or define three shapes assigned to the first category, two shapes assigned to the second category, and one shape assigned to the third category. In some implementations, once each shape has been defined and assigned to a category, the first processing engine 113 can send a signal to the database 125 indicative of an instruction to store data representing and/or associated with the categorized shapes. As such, the database 125 can be configured to store segmented data of the orthomosaic image 152 defined by and/or generated by the first processing engine 113.

The first processing engine 113 can be configured to assign each data point, pixel, and/or shape to one of any suitable number of categories. The categories can be based on, for example, user preference and/or user-defined categories, industry standards associated with architectural drawings, engineering drawings, site plans, site surveys, and/or the like. Moreover, the categories can be associated with and/or indicative of the type of structure, feature, and/or object represented in or by a data point, pixel, and/or shape. A non-limiting example of categories can include geological features such as ground, vegetation, tree, rock, water, etc.

and/or manmade features such as building, road, sidewalk, parking lot, drainage, utility, etc., and/or any other suitable category. In some instances, the categories can include a category associated with industry standard layers used in CAD files. Moreover, in some such instances, layers (and thus, categories) can be based on and/or associated with a class or type of feature assigned to that layer. For example, classes and/or types of layers (and thus, categories) as well as layers included in the classes and/or types are shown in Table 1, below:

TABLE 1

| Survey and Mapping Layers | | | |
|---|---|---|---|
| Roads | Control points | Property boundary | Steam system |
| Easements | Driveways | Railroad | Storm drainage and |
| Bridge | Easements | River | sewer system |
| Buildings and | Fuel gas | Riprap | Sidewalks |
| primary structures | Natural gas | Right-of-way | Topography |
| Political boundaries | Node | Site features | Unidentified site |
| Buffer zone area | Power | Sanitary sewer | objects |
| Navigable channels | Parking lots | system | Water supply |
| Communications | | | |

| Civil Layers | | | |
|---|---|---|---|
| Airfields | Driveways | Perc testing | Sanitary sewer |
| Buildings and | Ditches or washes | Parking lots | Steam system |
| primary structures | Easements | Ponds | Storm sewer |
| Baseline | Fences | Power | Sidewalks |
| Test borings | Fire protection | Property | Triangulated |
| Bridge | system | Pavement | irregular network |
| Cable TV | Erosion and | Railroad | Topography |
| Cemetery | sediment control | River | Trails or paths |
| Navigable channels | Flood hazard area | Roadways | Walls |
| Communications | Fuel gas | Riprap | Water supply |
| Control points | Limits of | Sight distance | systems |
| Drain fields | construction | Soils | Wetlands |
| | Natural gas | | |

| Annotation Layers | | | |
|---|---|---|---|
| Annotation | Legends, symbol | Read-me layer (not | Reference symbols |
| Bearings and | keys | plotted) | Text |
| distance labels | Markers, break | Revision clouds | Data tables |
| (survey coordinates) | marks, leaders | Redlines | Drawing or detail |
| Dimensions | Match lines | Reference, external | titles |
| Identification tags | Notes | files | Border and title |
| Keynotes | Non-plotting graphic | Revisions | block |
| Labels | information | Schedules | |

| Geotechnical Layers | | | |
|---|---|---|---|
| Borings | | | |

| Landscape Layers | | | |
|---|---|---|---|
| Annotation | Proposed grading | Site improvements | |
| Irrigation | Plant and landscape material | | |

| Structural Layers | | | |
|---|---|---|---|
| Beams | Column grid | Joists | Stairs |
| Bracing | Foundation | Property lines | Trusses |
| Columns | Joints | Slab | Walls |
| Structural deck | | | |

| Architectural Layers | | | |
|---|---|---|---|
| Area | Doors | Furnishings | Lighting fixtures |
| Ceiling | Equipment | Glazing | Roof |
| Columns | Floor | HVAC | Walls |
| Conveying systems | | | |

| Interiors Layers | | | |
|---|---|---|---|
| Area | Doors | Finishes | HVAC |
| Casework | Equipment | Furnishings | Millwork |
| Ceiling | Floor | Glazing | Partitions |
| Columns | | | |

| Equipment Layers | | | |
|---|---|---|---|
| Casework | Exhaust | Minor equipment | Power |
| Computer equipment | Major equipment | Not in contract equipment | Special equipment |

TABLE 1-continued

Fire Protection Layers

| | | |
|---|---|---|
| Aqueous film-forming foam system | Halon | Fire protection system |
| CO2 system | Inert gas | Sprinkler system |

Plumbing Layers

| | | |
|---|---|---|
| Acid waste systems | Medical gas | Storm drainage systems |
| Domestic water systems | Sanitary drainage systems | |

Mechanical Layers

| | | | |
|---|---|---|---|
| Annotation | Domestic water systems | Glycol systems | Relief air systems |
| Brine systems | | Hot water heating system | Energy recovery systems |
| Chimneys and stacks | Dual temperature systems | HVAC systems | Refrigeration systems |
| Compressed/processed air systems | Dust and fume collection systems | Laboratory gas systems | Smoke extraction systems |
| Condenser water systems | Electric heat | Machine shop | Special systems |
| Controls and instrumentation | Energy management systems | Medical gas | Steam systems |
| Chilled water systems | Exhaust system | Make-up air systems | Test equipment |
| | Fuel systems | Natural gas systems | |
| | Fume hood | Process systems | |

Electrical Layers

| | | | |
|---|---|---|---|
| Alarm system | Control systems | Intercom system | Paging system |
| Auxiliary systems | Data outlets | Legend of symbols | Power |
| Bell system | Diagrams | Lighting | Security |
| Cable system | Central dictation system | Lightning protection system | Site |
| Closed-circuit TV | | | Sound/PA system |
| Clock system | Ground system | Nurse call system | TV antenna system |

Telecommunications Layers

| | | | |
|---|---|---|---|
| Alarm system | Closed-circuit television system | Energy monitoring control system | Paging system |
| Bell system | | | Telephone system |
| Cable systems | Data/LAN system | Fire alarm system | Security system |
| Cable television system | Dictation system | Intercom/PA systems | Sound system |
| Clock systems | Electrical system, telecom plan | Nurse call system | Television antenna system |

In some instances, the layers and/or categories can also include any suitable layer and/or category associated with one or more processes and/or the like.

In some instances, the categories can have and/or can be associated with one or more characteristics against which a data point can be evaluated. A non-exhaustive list of categories and associated characteristics is provided below:

Building—an elevation above a certain identified threshold and/or color information matching images of a building stored in a database.

Road—an elevation that satisfies a ground threshold and/or color information matching images of a road stored in a database.

Sidewalk—an elevation that satisfies the ground threshold and/or color information matching images of a sidewalk stored in a database.

Parking Lot—an area that otherwise would be classified as Road and color information deviates from the images of a road (e.g., stored in a database) in an identifiable way and/or color information matching images of a parking lot stored in a database.

Building Detail—an area classified as Building and color information and/or elevation information deviating from the information otherwise indicating Building based on information of a building stored in a database.

Road Detail—traffic control signals or lines within an area classified as Road and/or color information matching the images of road details stored in a database.

Utilities—an area which may or may not be otherwise classified as a broader classification with color information matching the images of utilities stored in a database.

Wall—a surface otherwise classified as Building and that is at least quasi vertical with an identifiable start and end.

Window—a surface otherwise classified as Wall and color information that is identifiably different from color information associated with Wall and/or color information matching images of a window stored in a database.

Door—a surface otherwise classified as Wall and color information that is identifiably different from color information associated with Wall and/or color information matching images of a door stored in a database.

Roof—a surface otherwise classified as Building and that is non-vertical with an elevation above the ground threshold.

In some instances, the database 125 can store any number of categories, a set of which can be selected by a user for a specific site of interest and/or automatically selected based on the machine learning model analyzing data associated with the specific site of interest. For example, an undeveloped site of interest (e.g., a planned construction site and/or the like) may be associated with a set of categories related to geologic features rather than manmade structures.

In some instances, the categories can be arranged in hierarchy and/or otherwise assigned to a position in a desired priority order. For example, in some instances, the hierarchy and/or priority can be based on which category is more likely to be the accurate category for the data point, pixel, and/or shape shown in the orthomosaic image 152. As described above, the first processing engine 113 is configured to assign each data point, pixel, and/or shape to a single category. Thus, if a data point, pixel, and/or shape would be associated with and/or assigned to multiple categories, the first processing engine 113 can be configured determine the position and/or status of each of the potential categories in the hierarchy and/or priority order and can assign that category to the data point, pixel, and/or shape. For example, in some instances, the first processing engine 113 may determine that a data point, pixel, and/or shape could be associated with a "building" category, a "road" category, and a "ground" category. In such instances, the ground category can be assigned a lowest position in the hierarchy and/or priority because each of a building and a road is built on and/or covers the ground at the site of interest. Similarly, a building generally has a higher elevation than a road (e.g., when built on a site of interest otherwise having a relatively constant elevation) and thus, is assigned the highest position in the hierarchy and/or priority. Accordingly, in the example just described, the first processing engine 113 will assign the "building" category to the data point, pixel, and/or shape based on the hierarchy and/or priority of the specific categories. In some instances, a user can define a hierarchy and/or priority for all or a subset of categories stored in the database 125.

In some instances, the categories can be associated with varying levels of detail. For example, some categories can be broad or general categories with any suitable number of additional categories associated with one or more details of the broad or general category. In some instances, the categories can be nested in a hierarchy, grouping, and/or the like. For example, each category of a group of categories associated with detailed features of a building can be nested in a category such as "building detail," which in turn, can be nested in the broad or general category of "building." In other words, some categories can be arranged in any suitable group or nesting such that detailed categories are grouped and nested into and/or under broader or more general categories. In other instances, the categories describing one or more details need not be grouped or nested.

The detailed categories can be associated with any suitable detail and/or feature of the broader and/or more general category. For example, a "building detail" category can be assigned to data points, pixels, and/or shapes associated with building boundary lines, walls, doors, windows, roofs, utilities, etc. of a building. Similarly, a "road detail" category can be assigned to data points, pixels, and/or shapes associated with, for example, traffic control markers (e.g., symbols or lines painted or disposed on the road), etc. In some instances, the first processing engine 113 can be configured to identify and categorize the data points and/or pixels in the "detail" category and can define the corresponding categorized shape without modifying the broader and/or more general category. More specifically, because the first processing engine 113 assigns each data point, pixel, and/or shape to a single category, a shape formed by data points and/or pixels in the detail category—when removed, hidden, and/or otherwise not considered—could result in an absence of that shape in the broader and/or more general category. For example, the first processing engine 113 and/or the machine learning model can determine the presence of a first shape assigned to a detail category (e.g., "road detail" category) contained and/or at least partially surrounded by a second shape assigned to a broader and/or more general category (e.g., "road" category). As such, the first processing engine 113 and/or the machine learning model can assign the first shape to the detail category independent of the second shape assigned to the broader and/or more general category such that the categorization of the first shape does not result in a corresponding absence, cut out, and/or hole in the second shape.

As shown in FIG. 3, after the first processing engine 113 identifies, categorizes, and/or segments the data in the orthomosaic image 152, the second processing engine 114, for example, can be configured to filter and/or otherwise further process the segmented data and to generate at least one of a 2D output 132 and/or a 3D output 134. For example, in some implementations, the second processing engine 114 can receive the segmented data from the first processing engine 113 and/or from the database 125. Upon receipt, the second processing engine 114 is configured to identify data points and/or pixels and/or groups thereof that are adjacent and that are associated with the same category. In some instances, the second processing engine 114 can identify the borders of a group of data points and/or pixels forming a shape to borders of a different group of data points and/or pixels forming a different shape to define, for example, a new shape (e.g., a combined shape). In addition, the second processing engine 114 can be configured to identify any uncategorized data points and/or pixels that are adjacent to the border that otherwise should be similarly categorized and/or otherwise should form a part of the newly formed shape.

After defining one or more desired shapes, the second processing engine 114 can be configured to define a polyline (e.g., a line in vector format) passing through a position associated with at least some of the data points and/or pixels forming the border of the shape. In other words, the second processing engine 114 can define a vector that passes through at least some of the data points and/or pixels (or a position of those data points and/or pixels) that form the border of the shape. Expanding further, in some instances, the second processing engine 114 can be configured to define a polyline (e.g., a line in vector format) that uses at least some of the data points (e.g., pixels in raster format) that form a boundary of the shape. As such, the second processing engine 114 can define a polyline boundary for each shape in the segmented data of the orthomosaic image 152. Moreover, in some instances, the second processing engine 114 can be configured to define and/or assign the category of each shape in the orthomosaic image 152 to the polyline boundary (e.g., in vector format) of that shape (e.g., in raster format).

In some instances, the second processing engine 114 can define a polyline boundary of a shape that completely encloses the shape. That is to say, the polyline boundary creates and/or defines a closed polygon shape in vector format. In other instances, however, a border of a feature may not be within the boundary of the site interest. For example, a road may pass through a portion of a site of interest that has a starting and an ending portion that are disposed outside of the boundary of the site of interest. As such, a portion of the shape corresponding to the road may have one or more open ends and/or ends that do not have a clear border. In some such instances, the second processing engine 114 can define a border of the road based on a set of pixels forming a corresponding portion of a border of the image (e.g., an edge or outermost line of pixels) and associated with the road category. Thus, the second processing engine 114 can create and/or generate a polyline along the corresponding portion of the border of the image (e.g., create and/or generate a polyline that connects the end points of the polylines defining the sides of the road. In some instances, this can be performed as the second processing engine 114 creates the polyline boundaries for the shapes or a post-process or secondary process once the second processing engine 114 creates the polyline boundaries for the shapes. In this manner, the second processing engine 114 can define a closed polyline boundary for each shape. In other instances, the second processing engine 114 can determine that the border of the image is not the border of the shape and, as such, can be configured such that a polyline otherwise closing the shape is not created and/or generated.

Moreover, while some polyline boundaries of the shapes can be adjacent, can at least partially overlap, and/or can have substantially the same coordinates, each shape can be distinct from each other shape (and a polyline boundary of a shape can be distinct from a polyline boundary of another shape) regardless of that shapes category. In some instances, adjacent and/or overlapping borders of shapes may result in a border being assigned to a single category. In such instances, the second processing engine 114 can be configured to define a polyline boundary for the shape having the border associated with the unassigned category. For example, in some instances, the second processing engine 114 can determine and/or identify that the shape is open and thus, may close the shape by defining a polyline boundary for that border and associated with the corresponding category. Thus, polylines associated with different categories can be adjacent and/or can at least partially overlap while remaining distinct from each other.

Having defined the polyline boundary for each shape, the second processing engine 114 can be configured to filter, smooth, simplify, and/or otherwise process the boundaries of the shapes. For example, in some instances, forming the polyline using at least some of the data points and/or pixels (as described above) can result in a polyline having a large number of points, nodes, etc., which in turn, can result in an irregular path that may not be an accurate model of the feature at the site of interest. In addition, a polyline having a large number of points, nodes, etc. can result in and/or can be associated with an undesirable use or burden on resources of the host device 110 (e.g., processing resources of the processor 112 and/or memory resources of the memory 120) and/or an electronic device used to view a generated CAD file. Accordingly, the second processing engine 114 can be configured to analyze a polyline boundary with respect to a position of each point associated with the border of the shape and at least one other point associated with the border of the shape to determine and/or define an amount that the position of that point deviates from a desired, expected, and/or anticipated position. For example, in some instances, the second processing engine 114 can determine whether an angle of a line defined between a first point and a second point is less than a threshold angle and/or whether a length of the line defined between the first and second point is less than a length or distance threshold. In such instances, when the angle and/or length of the line defined between the first and second points are less than the angle threshold and the length threshold, respectively, the polyline can be simplified, filtered, and/or replaced, for example, by a straight and/or otherwise simplified polyline.

In some instances, the second processing engine 114 can be configured to smooth and/or simplify a polyline or a portion of a polyline defined between a first point (e.g., a starting point of the polyline) and a second point (e.g., an ending point of the polyline) by evaluating a deviation of the position of each point on the polyline between the first point and the second point relative to, for example, a position of a point otherwise on a straight polyline defined between the first point and the second point. In some such instances, the smoothing, straightening, and/or simplifying of the polyline can be similar to, for example, defining a linear regression between two points with any suitable number of points disposed therebetween. Thus, if a deviation of a position of each point on the polyline between a first point and a second point relative to the defined regression line is less than a deviation threshold, the second processing engine 114 can straighten, smooth, and/or simply the polyline and/or at least the portion of the defined between the first point and the second point. In some instances, the first point and the second point can be based on, for example, a number of points on the polyline between the first point and the second point (e.g., 1 point, 2 points, 3 points, 4 points, 5 points, 6 points, 7 points, 8 points, 9 points, 10 points, 15 points, 20 points, 30 points, 50 points, 100 points, 200 points, 500 points, 1000 points, and/or more or any number of points therebetween). In other instances, the first point and the second point can be based on, for example, a threshold length (e.g., either a minimum length or a maximum length). In still other instances, the first point and the second point can be based on an angle of the polyline defined between the first point and the second point and an angle between at least one of a different polyline defined between the first point and a third point or a different polyline defined between the second point and the third point. In yet other instances, the first point and the second point can be user defined and/or can be defined and/or determined via any other suitable method.

Figure 7:
FIGS. 7 and 8 are each an example of a 2D computer-aided design file created and/or defined, for example, by the system of FIG. 1.

In some instances, the second processing engine 114 can be configured to replace the polyline and/or the portion of the polyline with a new polyline defined between the first point and the second point when a deviation of the position of each point is less than the deviation threshold. In other instances, the second processing engine 114 can be configured to remove and/or delete each point otherwise on the polyline or the portion of the polyline defined between the first point and the second point when the deviation of the position of each point is less than the deviation threshold. As a result, the polyline and/or the portion of the polyline defined between the first point and the second point that passed through each point (e.g., the complex and/or otherwise noisy, non-simplified, and/or non-smoothed polyline or portion thereof) now is a straight polyline defined between the first point and the second point (e.g., with or without one or more points disposed on the straight polyline defined between the first point and the second point). As such, the second processing engine 114 can be configured to create and/or generate filtered, smoothed, simplified, and/or processed polyline boundaries as shown, for example, in the at least partially processed image 155 illustrated in FIG. 7.

As described above, in some instances, the second processing engine 114 can be configured to evaluate compare a deviation in a position of a point relative to, for example, a deviation threshold. In some instances, the deviation threshold can be defined by a user or can be a preset or predefined deviation threshold. In some instances, the deviation threshold can be expressed in terms of a distance and/or angle from a desired position otherwise on a straight line defined between two point (e.g., a regression line and/or the like). In other instances, the deviation threshold can be expressed in terms of a percentage of deviation (e.g., a position of a point may deviate from a desired or calculated position by a certain percent) and the deviation threshold can be a maximum percentage of deviation allowed for smoothing or the like. In still other instances, the deviation threshold can be expressed in terms of a number of standard deviations (e.g., less than one standard deviation, less than two standard deviations, etc.) from a desired position such as, for example, a position of a regression line or the like.

After filtering, replacing, smoothing, etc. the polyline boundaries of each shape, the second processing engine 114 can be configured to generate a CAD file including a 2D and/or a 3D model of each shape based on, for example, the polyline boundaries. In addition, the second processing engine 114 can be configured to define a layer in the CAD file for each category. In this context, a layer can be a list of objects, shapes, and/or points that can be handled, grouped, and/or displayed together using CAD software. As described above, in some instances, the categories and thus, the layers can be any suitable category and/or layer. As a specific example, layers can include ground, building, building detail, road, road detail, sidewalk, parking lot, vegetation, drainage, utility, and/or any other suitable layer. With the desired layers defined, the second processing engine 114 can place each shape on and/or can otherwise associate each shape with its corresponding layer according to its category.

Figure 8:
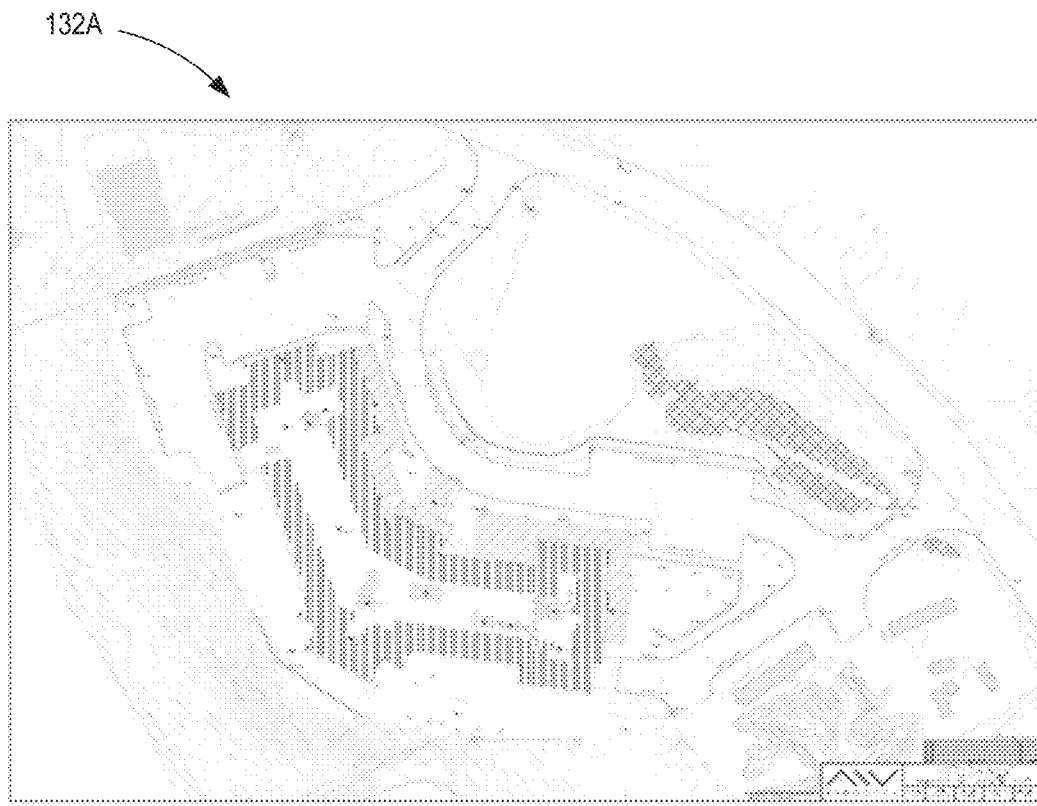

As shown in FIG. 3, the second processing engine 114 is configured to generate one or more CAD files such as, for example, the 2D output 132 and/or the 3D output 134. In some instances, the 2D output 132 can be a CAD file including a 2D drawing such as a site plan. More particularly, a site plan can be, for example, a set of 2D architectural, engineering, landscape, construction, and/or site drawings that can provide a top view graphic representation of the arrangement of the features included in or on the site of interest. A non-limiting list of features shown on a site plan can include property lines, footprints of existing or planned buildings, distances and/or dimensions of or between features, parking lots, roads, sidewalks, landscaped areas, bodies of water, easements, utilities, drainage, ramps, footpaths, contours, gradients, slopes, and/or any other suitable feature. For example, FIG. 8 illustrates a graphic representation of a site plan 132A generated, for example, as a 2D output (e.g., the 2D output 132) of the second processing engine 114. In some instances, the site plan 132A can include, for example, geolocation data, relevant dimensions of one or more features, and/or any other suitable data.

Figure 9:
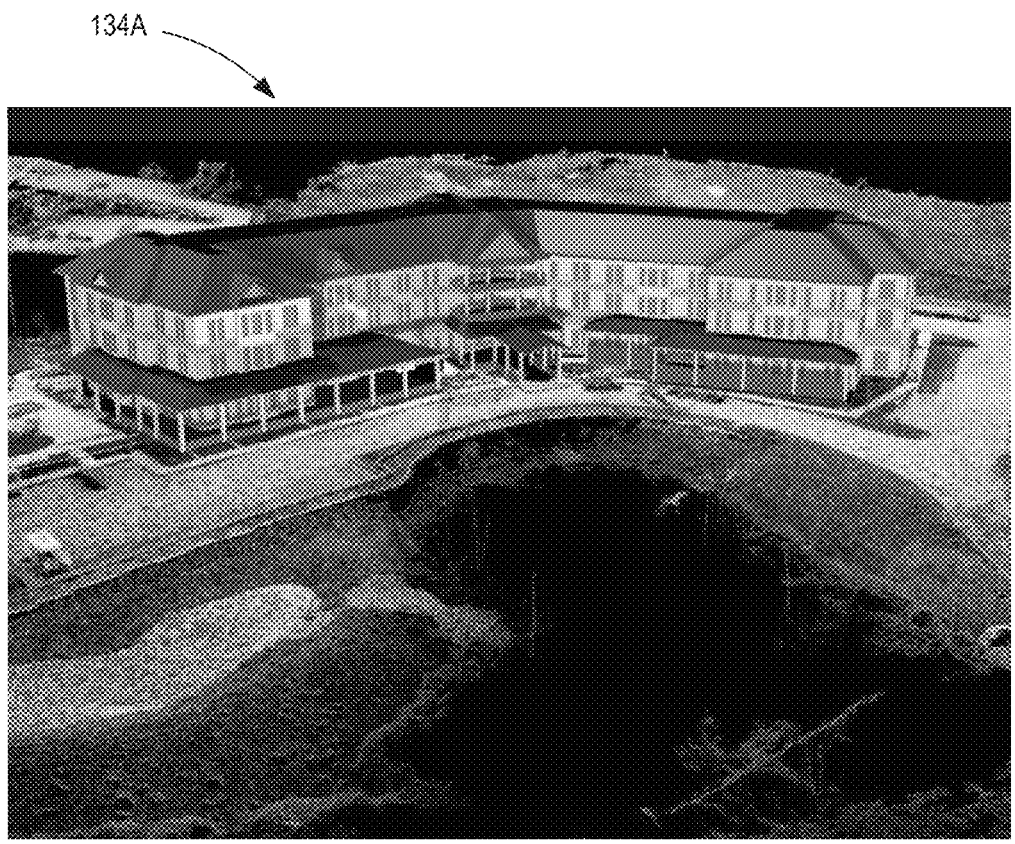
FIG. 9 is an example of a 3D computer-aided design file created and/or defined, for example, by the system of FIG. 1.

The second processing engine 114 can also generate the 3D output 134, as shown in FIG. 3. The 3D output 134 can be a CAD file including a 3D model or drawing of one or more features and/or structures included in or on the site of interest. In some instances, for example, the 3D output 134 can be a 3D model of one or more building. A 3D model of a building 134A is shown, for example, in FIG. 9. As shown, the 3D model of the building 134A can include the general shape, footprint, and/or outline of the building as well as specific details of the building, which can correspond to the shapes assigned to those specific detailed categories (e.g., identified and categorized by the first processing engine 113). For example, the 3D model of the building 134A can include details such as, for example, walls, doors, roofs, windows, awnings, chimneys, pipes, equipment, connections, structures, bolts, cables, etc. In addition, the 3D model can include and/or graphically represent details such as the type of material used to make one or more walls and/or the like.

The second processing engine 114 can be configured to generate the one or more CAD files (e.g., the 2D output 132 and/or the 3D output 134) in any suitable CAD file format. For example, in some instances, the second processing engine 114 can generate the one or more CAD files in drawing interchange format or drawing exchange format (known as a DXF file). In other instances, the CAD files can be generated in any suitable neutral CAD format such as, for example, standard for the exchange of product media data (known as a STEP file), initial graphics exchange specification (known as an IGES file), and/or any other suitable CAD file. In still other instances, the CAD files can be generated in any suitable CAD format used by any suitable CAD program. Accordingly, a user can use any suitable CAD software to open, view, and/or modify the CAD files generated by the second processing engine 114.

A second example of processing aerial data is provided below. As described above, the orthomosaic image 152 can be in a geotiff format in which each pixel in the geotiff is assigned a value or set of values based on its color (e.g., an RGB value). In addition, each pixel is georeferenced such that each pixel is a representation of its true location on the Earth's surface (e.g., within a desired tolerance). Thus, as described above, the first processing engine 113 can be configured to provide as input any suitable number of variables indicative of each pixel's color value and position defined by its X and Y coordinates in the geotiff coordinate system, which in turn, can analyze the dataset to identify and/or categorize one or more shapes formed by a set and/or cluster of pixels.

Figure 10:
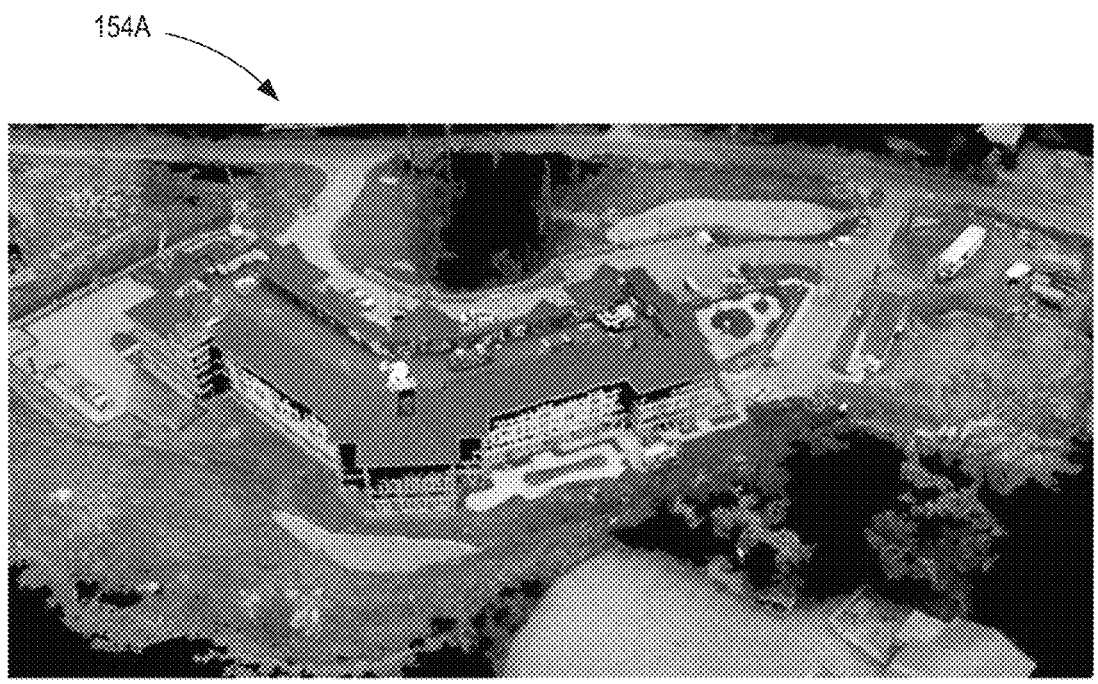
FIG. 10 is an example of a point cloud image, which can be used by the system of FIG. 1 to automatically create and/or define computer-aided design files.

In this example, however, the first processing engine 113 can receive the orthomosaic image 152 and the point cloud 154, which are both provided as input into the machine learning model (described above). As described above, the point cloud 154 can be a set of data points that can model, for example, the topography of the site of interest. In some instances, the data points can represent a 3D surface representing an overlay of the Earth's surface at the site of interest including data points indicative of a ground surface, plants, trees, bodies of water, sidewalks, roads, bridges, buildings, and/or any other suitable feature or structure. For example, FIG. 10 illustrates a point cloud 154A of a site of interest, which can be provided as input into the first processing engine 113. In some instances, each data point in the point cloud 154 can be aligned and/or can correspond to different data point (e.g., pixel) in the orthomosaic image 152. Thus, the first processing engine 113 can combine the data from the orthomosaic image 152 and the data point cloud 154 and can provide a combined dataset as input into the machine learning model, as described in further detail herein.

Each data point in the point cloud 154 (e.g., a data point generated via photogrammetry, generated as an output of a LiDAR scan, and/or the like) can be georeferenced allowing the point cloud to represent the true location of the point cloud on the Earth's surface (within a predetermined tolerance). Accordingly, each data point in the point cloud 154 can include data indicating a position of the data point in, for example, the X-Y plane, as described above with reference to the orthomosaic image 152. In addition to being georeferenced, each data point in the point cloud 154 can also include data indicative of an elevation of that data point. Thus, the position of each data point is defined by its X, Y, and Z coordinates. In instances in which the point cloud 154 is generated via photogrammetric analysis, each data point in the point cloud 154 (e.g., each pixel in the point cloud image) can include a color value.

In some instances, at least a portion of the data in the point cloud 154 can be used to verify corresponding data in the orthomosaic image 152. For example, as described above, each data point (e.g., pixel) in the orthomosaic image 152 can include data defining that data point's position defined by its X and Y coordinates and its color value (e.g., a data vector defined and/or described as [X,Y,R,G,B]) and each data point (e.g., pixel) in the point cloud 154 can include data defining that data point's position defined by its X, Y, and Z coordinates and its color value (e.g., a data vector defined and/or described as [X,Y,Z,R,G,B]). Accordingly, in some instances, the X, Y, R, G, and B value or data for a data point in the point cloud 154 can be used to verify the X, Y, R, G, and B value or data for a corresponding data point in the orthomosaic image 152 (or vice versa).

As such, in this example, the first processing engine 113 can be configured to provide as input into the machine learning model any suitable number of variables indicative of each pixel's position defined by its X, Y, and Z coordinates and its color value (e.g., a vector defined and/or described as, for example, [X,Y,Z,R,G,B]). In some instances, the machine learning model can be configured to process the additional elevation variable in the same convolutional layer. In other instances, the machine learning model can include an additional convolutional layer for processing the elevation variable.

In some implementations, the first processing engine 113 can be configured to analyze each data point to determine a classification of that data point. For example, in some instances, a threshold elevation can be defined (e.g., by a user or automatically but the first processing engine 113) such that any data point having an elevation at or below the threshold elevation is assigned, for example, to a ground class and any data point having an elevation above the threshold elevation is assigned, for example, to a non-ground class (e.g., a binary class in which the ground class has a value of "zero" and the non-ground class has a value of "one", or vice versa). In such implementations, the class value can be an additional variable input into the machine learning model and thus, the variables can be a vector defined and/or described as, for example, [X,Y,Z,R,G,B, class].

In some instances, the additional data based on an elevation of each data point can increase an accuracy of the output generated by the machine learning model. In some instances, the elevation can facilitate the categorization of the data points. For example, if a data point is classified in the ground class, then the data point can be ignored and/or discarded when assigning data points to, for example, the building category as a data point in the building category would be classified in the non-ground class. As such, the first processing engine 113 can process the data points from both the orthomosaic 152 and the point cloud 154 to identify and/or categorize each pixel and to identify and/or categorize one or more shapes containing a set or cluster of similarly categorized data points. As a result, the first processing engine 113 can output a segmented dataset which can be stored in the database 125 and further processed by the second processing engine 114 to generate the 2D output 132 and/or the 3D output 154, as described in detail above.

While described above as defining the CAD file based on aerial data including both the orthomosaic image 152 and the point cloud 154, in other instances, the machine learning model can generate a first output as a result of analyzing the orthomosaic image 152 and can generate a second output as a result of analyzing the point cloud 154. The first processing engine 113 can then compare the first and the second outputs to verify and/or enhance the first and/or the second output.

In some implementations, the aerial data input into the machine learning model can be data from the point cloud 154 without the orthomosaic image 152. For example, as described above, the point cloud 154 can include a vector of data for each data point defined and/or described as [X,Y,Z,R,G,B] and the orthomosaic image 152 can include a vector of data for each data point defined and/or described as [X,Y,R,G,B]. As such, in some instances, data in the point cloud 154 can be the same as a combined data set of the orthomosaic image data and the point cloud data. Thus, the machine learning model can be configured to output segmented data based on, for example, geolocation data and/or values, elevation data and/or values, color data and/or values, class data and/or values, and/or any other suitable data and/or values included in the point cloud 154.

A third example of processing aerial data is provided below. In this example, the first processing engine 113 can receive the point cloud 154, which can be analyzed algorithmically rather than via the machine learning model (described above). In some instances, the processed and/or segmented data output from the first processing engine 113 using the algorithmic analysis can be used to check, verify, augment, and/or supplement the machine learning model.

As described above, the point cloud 154 can be a set of data points representing a 3D mesh that can model, for example, the topography of the site of interest (see, for example, the point cloud 154A in FIG. 10). Each data point in the point cloud 154 (e.g., a data point generated via photogrammetry, generated as an output of a LiDAR scan, and/or the like) can be georeferenced allowing the point cloud to represent the true location and a true elevation of each data point in the point cloud on the Earth's surface. Accordingly, each data point in the point cloud 154 can include data indicating a position of the data point defined by its X, Y, and Z coordinates.

In this example, the first processing engine 113 can be configured to perform ground segmentation using a Progressive Morphological Filter (PMF) (referred to herein as "PMF segmentation"). For example, the first processing engine 113 can separate data points associated with ground features from data points associated with non-ground features by evaluating the data associated with each data point underneath a moving evaluation window. The density of a portion of the point cloud under and/or encompassed by the evaluation window can be calculated, and together with data associated with the type of site of interest (e.g., an urban site, a natural site, and/or a combination thereof), can be used to determine a desired set of parameters for the ground segmentation (e.g., a cell size and initial distance for the morphological moving window which is used to define the boundaries of the data set being analyzed). For example, the morphological moving window can be a window or frame that can limit data being analyzed to the data that is inside and/or bounded by the window or frame. Once the desired parameters are determined, the first processing engine 113 can perform the ground segmentation to separate the data points associated with ground features and the data points associated with non-ground features.

In some instances, the first processing engine 113 can then execute one or more processes to cluster the non-ground data points based on a density of the non-ground data points. For example, the density of the non-ground data points can be used to determine a minimum cluster size. More specifically, the first processing engine 113 can determine and/or define a set of features of interest and, for each feature, can determine a minimum number of data points that can be used to sufficiently represent that feature of interest (e.g., a minimum number of data points that can sufficiently represent a building). For each feature of interest, the first processing engine 113 can cluster a set of data points that satisfy the desired density threshold and/or criterion and any data set not belonging to a cluster can be discarded and/or otherwise not considered.

The first processing engine 113 can then evaluate each cluster relative to a desired height filter. For example, the height filter (e.g., elevation criterion) can be a minimum height for a feature to be considered the feature of interest (e.g., a minimum height for a feature to be considered a building). The height threshold can be automatically defined based on the feature of interest or can be user-defined. As such, the first processing engine 113 evaluates a maximum height of the data points in each cluster relative to the defined height threshold and/or criterion (e.g., an elevation criterion) and any cluster not meeting or exceeding the threshold and/or otherwise not meeting the criterion can be discarded and/or otherwise not considered.

In some instances, after the first processing engine 113 has filtered the non-ground data points based on, for example, density, height, and/or any other suitable parameter, the first processing engine 113 can be configured to convert the non-ground data points into a greyscale geotiff format. The first processing engine 113 can then analyze the data points (e.g., pixels) in the geotiff to determine, identify, and/or define contours associated with the data points. For example, in some instances, the first processing engine 113 can evaluate a greyscale value of each pixel relative to a desired threshold greyscale value such that any pixel having a greyscale value equal to or below the threshold greyscale value is assigned a first binary value (e.g., a "zero") and any pixel having a greyscale value above the threshold greyscale value is assigned a second binary value (e.g., a "one"). As such, the first processing engine 113 can identify one or more areas, regions, clusters, etc. having a relatively high concentration of similar pixel values, which can be used to segment data points associated with the feature of interest (e.g., a building) from background features (e.g., non-buildings).

In some instances, the first processing engine 113 can then evaluate one or more contours and/or compactness of each area having the relatively high concentration of similar pixel values and can, for example, filter out areas in which the contours and/or compactness are indicative of noise rather than the feature of interest. Similarly stated, the first processing engine 113 can filter out areas in which the contours and/or compactness do not satisfy a desired criterion (e.g., a regularity criterion or threshold, and/or the like). For example, in some instances, the first processing engine 113 can analyze and/or determine a contour and/or surface of the data point in a given cluster and can assign a value associated with that contour and/or a value associated with the compactness of the data point. As such, the first processing engine 113 can compare the assigned value with a value indicative of the regularity criterion and/or threshold and can filter out areas and/or clusters in which the value does not satisfy the criterion In other instances, the first processing engine 113 can perform any suitable filtering process to remove undesired noise. For example, in some instances, the first processing engine 113 can evaluate an area's and/or a cluster's fractal dimension index (FRAC), which can represent a value indicative of a shape's complexity. The possible FRAC values are between 1 and 2, with higher values representing highly complex figures that can, for example, depart from Euclidean geometry and thus, are not likely to be a feature of interest (e.g., a building). In some instances, each area and/or cluster can be evaluated relative to additional characteristics of the feature of interest. For example, a set of characteristics associated with a building can include an edge (wall) length, an angle between edges, and/or any other suitable characteristic. In some instances, the remaining data points (pixels) can be georeferenced to ensure the data points are representative to the true position on the Earth's surface. Moreover, the process described above can be performed relative to each feature of interest. As such, the first processing engine 113 can identify, categorize, and/or segment the data in the point cloud 154 (now in geotiff format) and can output the segmented data, which in turn, can be stored in the database 125 and further processed by the second processing engine 114 to generate the 2D output 132 and/or the 3D output 154, as described in detail above.

As described above, in some instances, the segmentation of the data into identified and categorized shapes and/or features can be used to verify an output of the machine learning model relative to the same data points. For example, in some instances, any data point determined to be associated with a feature of interest using the PMF segmentation process (e.g., the process not using machine learning) can be assigned a value (e.g., a value of "one"). The first processing engine 113 can then evaluate the value of the data points resulting from the PMF segmentation and the output of the machine learning model. In some instances, if the first processing engine 113 determines that the PMF segmentation generated a value of a data point (e.g., pixel) that indicates a presence of a feature of interest, the value of the data point generated by the PMF segmentation can replace a value of the corresponding data point generated by the output of the machine learning model. Conversely, if the value of the data point from the PMF segmentation does not indicate the presence of a feature of interest, the value of the data point generated by the output of the machine learning model is not replaced. Accordingly, the output of the PMF segmentation can be used to verify and/or improve the output of the machine learning model and/or can be used to supplement the machine learning model.

Some implementations of the system 100 are described above as including machine learning models that are configured to "learn" how to segment images and/or to identify and categorize shapes included in images as a result of "training." For example, as described above, the first processing engine 113 can be configured to provide aerial data as input into the machine learning model, which in turn, generates an output in which each data point (e.g., pixel) is associated with a category. In some implementations, however, the machine learning model implemented by the first processing engine 113 cannot generate a desired output prior to receiving training. In some instances, training can include, for example, providing data (e.g., images) with data points (e.g., pixels) that are clearly identifiable as belonging to a known category, which the machine learning model can use, for example, as a reference against data sets analyzed in the future.

As described in detail above with reference to the processing of images, during training, the first processing engine 113 can receive aerial data in the form of, for example, an orthomosaic geotiff. At a pixel level, the geotiff includes data indicating, for example, RGB color values associated with each pixel but the pixels are unlabeled and/or otherwise unassociated with a category. Training the machine learning model, however, uses categorized data points (e.g., pixels). Accordingly, in some instances, training the machine learning model can include preparing the data used during training.

For example, in some instances, the first processing engine 113 can convert the geotiff (e.g., a raster image) into a dxf format (e.g., a vector drawing). In some instances, the conversion of the geotiff format to the dxf format can be performed by manually tracing features in the raster image and assigning the traced features to a desired category (e.g., any of those described herein). In other words, the conversion includes defining one or more polyline boundaries corresponding to the borders of the features shown in the raster image. More particularly, the dxf format allows for labeling and/or categorizing of objects and grouping of the categorized objects into layers associated with the categories (as described above). In addition, a dxf file includes an internal Cartesian coordinate system (UCS), which can locate the objects displayed based on that objects X coordinate, Y coordinate, and Z coordinate. These coordinates can be translated and/or other carried over during conversion from the dxf format back to the geotiff format, as described in further detail herein.

In some instances, the data preparation can include processes and/or steps in addition to manually tracing the features, shapes, objects, etc. shown in the geotiff. For example, as described in detail above, in some instances, a feature may not form a closed shape and/or may have a portion that extends beyond a boundary of the site of interest. Accordingly, in such instances, the manual tracing of the features can also include closing any open shapes. In addition, the tracing and/or closing of the features can include ensuring that all extrusion directions of the polylines are aligned. In some instances, the data preparation can also be such that a shape or object is assigned to a single category and that assigning an object or shape to a detail category (e.g., "road detail") does not result in a hole or uncategorized region in the object or shape assigned to the broader and/or more general category (e.g., "road"). In other words, a feature on, for example, a detail category can be spatially enveloped by the broader and/or more general category in which the detail category is disposed.

After defining the polyline shapes and/or objects representing each feature and after placing each shape and/or object on the desired layer in the dxf file, the first processing engine 113 can be configured to convert the dxf file back into tiff format. More particularly, for each layer in the dxf file, the first processing engine 113 can identify and store (or cause the memory 120 to store) the coordinates of each shape and/or object on that layer and then can "rasterize" that layer (e.g., convert from vector format to raster format). As each layer is rasterized, every data point (e.g., pixel) is assigned a binary value based on whether a feature, shape, and/or object is in that location. In some instances, a positive classification (e.g., a feature is present) is assigned a value of "one", while a negative classification (e.g., no feature is present) is assigned a value of "zero". After rasterizing each layer, the first processing engine 113 can be configured to merge the data associated with each layer to define a final or merged dataset. In some instances, the merged dataset can be and/or can be converted into a one-hot vector dataset (e.g., a matrix of cells, in which each cell has a binary value or "zero" or "one") which can be input into the machine learning model.

In some instances, the first processing engine 113 can perform and/or execute a Softmax cost function to translate and/or define the merged dataset in the one-hot vector format and/or any other suitable format. The one-hot vector format of the merged dataset is such that each feature in the tiff is associated with only one binary value (e.g., a "zero" or a "one"). If a data point (e.g., pixel) is assigned a value of "one" during rasterization for more than one layer, the first processing engine 113 can be configured to apply a correction based on, for example, a priority and/or hierarchy of the categories, as described in detail above. Thus, for example, if a data point is associated with both road and sidewalk categories, the first processing engine 113 can be configured to assign the data point to the road category only based on the road category having a higher priority and/or higher status in the hierarchy (as described above). In some instances, the priority and/or hierarchy of the categories can be such that a detail category is assigned a higher priority and/or higher status in the hierarchy. As such, a data point assigned to both the road detail category and the road category can be corrected to be associated with only the road detail category. In addition, the first processing engine 113 can be configured to assign a predefined value to a data point that is not associated with any category. For example, in some instances, assigning a predefined value (e.g., 99 or any other suitable value other than "zero" and "one") can allow a data point that is not associated with any category to be distinguished from a data point that is not associated with a particular category (e.g., a data point assigned a "zero" for a given category).

In some instances, the image formed by the rasterized and merged layers can be segmented and/or split into tiles having a desired number of pixels (e.g., data points). For example, in some instances, the first processing engine 113 can be configured to segment and/or split the image into square tiles having a size of 224 pixels×224 pixels. Having segmented and/or split the image into tiles, the first processing engine 113 can be configured to provide as input to the machine learning model, each tile of pixels. Accordingly, the machine learning model can be trained by analyzing the merged dataset in which each data point includes and/or is associated with data defining, for example, a category associated with that data point, a color value associated with the data point, and/or any other suitable data.

In some instances, the training can be performed using any suitable machine learning model and/or architecture such as, for example, ResNet image segmentation model. In other instances, the training can be performed using, for example, RefineNet semantic segmentation model, FCDED, FRRN, Mobile U-Net, PSPNet, and/or any other suitable model such as those described herein. Although the first processing engine 113 is described above as segmenting and/or splitting the image into tiles having a specific size, in other instances, the first processing engine 113 can segment and/or split the image into any suitable number of tiles having any suitable size. In still other instances, the first processing engine 113 need not segment and/or split the image into tiles (e.g., the first processing engine may implement a machine learning model to perform image analytics without segmenting the image.

In some instances, the first processing engine 113 can perform and/or execute a loss function to determine and/or define an accuracy of the training. For example, the first processing engine 113 can measure a difference between the actual output and the desired outputs. For example, such a lost function can be represented by an equation in which loss=cost_function(Y, Y'). In other instances, the first processing engine 113 can determine and/or can define an accuracy of the training via an intersection over union method in which the first processing engine 113 measures a difference between an area of overlap (intersection) and an area of union. More particularly, the first processing engine 113 can be configured to determine and/or define the training accuracy by calculating a ratio of the number pixels correctly classified relative to the total number pixels analyzed (referred to as, for example, a "true positive" rate).

In some instances, the output of the machine learning model for each tile can be combined to generate and/or form the image including the categorization data and the color value for each pixel. In some instances, the first processing engine 113 can be configured to apply one or more filters and/or verifications in which the first processing engine 113 verifies that a detail category is enveloped by its corresponding broader or more general category (e.g., a pixel categorized as "road detail" is enveloped by pixels categorized as "road"), as described in detail above.

In some instances, the conversion of the original raster image in geotiff format to the vector image in dxf format, and then the conversion back to the raster image in tiff format can result in a loss of the georeferenced data in the original geotiff. In such instances, the first processing engine 113 can be configured to perform and/or execute one or more processes that can georeference the output image from the machine learning model. For example, the first processing engine 113 can be configured to identify and/or extract a source reference system from the original geotiff image, and can define and/or reference a location of each data point (e.g., pixel) in the output image relative to the source reference system, thereby georeferencing the output image.

Figure 11:
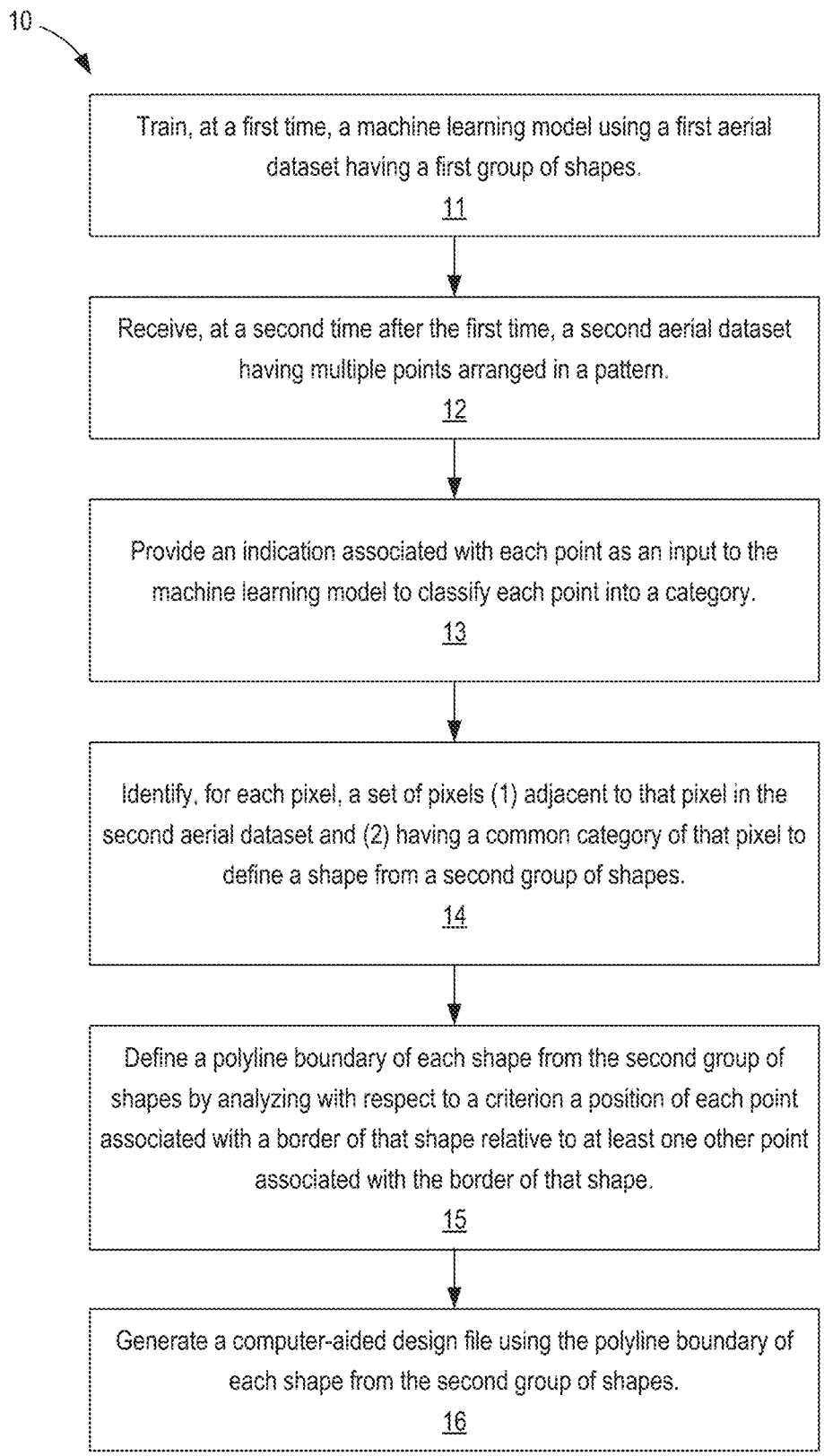
FIG. 11 is a flowchart illustrating a method for automatically creating and/or defining computer-aided design files using machine learning, according to an embodiment.

Referring now to FIG. 11, a method 10 of automatically defining a CAD file using machine learning can include training, at a first time, a machine learning model using a first aerial dataset having a first group of shapes, at 11. As described in detail above, in some instances, a host device (e.g., the host device 110) and/or a processor included therein (e.g., the processor 112) can be configured to receive a first aerial dataset such as an orthomosaic image of a site of interest. In such instances, a set of data points and/or pixels are arranged in a pattern, which in turn, form and/or define the image. In some instances, an image can be pre-processed prior to being received by the host device and/or the processor. For example, pre-processing can include, for example, converting the image (e.g., the raster image) into a vector image, defining each of the shapes using distinct polyline boundaries that fully encompass that shape (e.g., via tracing and/or any other suitable method), assigning each shape to a category, and rasterizing the image such that each data point (e.g., pixel) is categorized (as described in detail above). As such, the machine learning model can be trained using data in the first aerial dataset, as described in detail above.

In some instances, the host device and/or the processor can receive, at a second time after the first time, a second aerial dataset having any number of data points arranged in a pattern, at 12. The second aerial dataset can be, for example, an orthomosaic image of a site of interest in which each data point is represented by a pixel to form the image. In other instances, the second aerial dataset can be, for example, a point cloud including a 3D mesh of data points corresponding to an overlay surface of the site of interest. In still other instances, the second aerial dataset can include data associated with an orthomosaic image of the site of interest and a point cloud associated with the site of interest. The host device and/or processor can then provide an indication associated with each data point as an input to the machine learning model to classify and/or categorize each point into a category, at 13. As described in detail above, in some instances, the categories can be user defined and/or can be defined based on, for example, industry standard layers used in CAD files. While the data points are described above as being input into the machine learning model, in other implementations, the data points can be provided as input for any suitable image analytics such as, for example, the PMF segmentation analysis described above and/or the like.

The host device and/or the processor can be configured to identify, for each point, a set of adjacent points that have a common category with that point to define a shape from a second group of shapes, at 14. For example, in some implementations, the host device and/or the processor identify data for each point (e.g., pixel) such as, for example, a location data, color value data, category data, elevation data, and/or any other suitable data. Each shape can correspond to a feature on and/or in the site of interest. As described in detail above, the host device and/or the processor can provide as input to the machine learning model each data point in the second aerial data set and can be configured to output data (e.g., segmented data) associated with each shape and a category of each shape.

In some instances, the segmented data of the image can be stored, for example, in a database (e.g., the database 125) or memory. Moreover, the host device and/or the processor can be configured to define a polyline boundary of each shape from the second group of shapes by analyzing with respect to a criterion a position of each point associated with a border of that shape relative to at least one other point associated with the border of that shape, at 15. More specifically, in some instances, the host device and/or the processor can define a polyline boundary for each shape using at least some of the data points of the shape that define, are associated with, and/or otherwise represent a border of that shape. In some instances, the host device and/or the processor can then filter, smooth, simplify, and/or otherwise define the polylines by analyzing with respect to the criterion a position of each point relative to a desired and/or anticipated position of that point (as described in detail above with reference to FIG. 3). Moreover, each shape defined and/or formed by the polyline boundaries can be associated with and/or otherwise assigned to the category of the data points (e.g., pixels) contained in that shape. Accordingly, having defined the polyline boundaries of each shape and having categorized each of the shapes, the host device and/or the processor can be configured to generate a CAD file using the polyline boundary of each shape from the second group of shapes, at 16. The CAD file can then be opened, viewed, modified, etc. by any suitable CAD software.

Some embodiments described herein relate to a computer storage product with a non-transitory computer-readable medium (also can be referred to as a non-transitory processor-readable medium) having instructions or computer code thereon for performing various computer-implemented operations. The computer-readable medium (or processor-readable medium) is non-transitory in the sense that it does not include transitory propagating signals per se (e.g., a propagating electromagnetic wave carrying information on a transmission medium such as space or a cable). The media and computer code (also can be referred to as code) may be those designed and constructed for the specific purpose or purposes. Examples of non-transitory computer-readable media include, but are not limited to, magnetic storage media such as hard disks, floppy disks, and magnetic tape; optical storage media such as Compact Disc/Digital Video Discs (CD/DVDs), Compact Disc-Read Only Memories (CD-ROMs), and holographic devices; magneto-optical storage media such as optical disks; carrier wave signal processing modules; and hardware devices that are specially configured to store and execute program code, such as Application-Specific Integrated Circuits (ASICs), Programmable Logic Devices (PLDs), Read-Only Memory (ROM) and Random-Access Memory (RAM) devices. Other embodiments described herein relate to a computer program product, which can include, for example, the instructions and/or computer code discussed herein.

Some embodiments and/or methods described herein can be performed by software (executed on hardware), hardware, or a combination thereof. Hardware modules may include, for example, a general-purpose processor, a field programmable gate array (FPGA), and/or an application specific integrated circuit (ASIC). Software modules (executed on hardware) can be expressed in a variety of software languages (e.g., computer code), including C, C++, Java™ Ruby, Visual Basic™, and/or other object-oriented, procedural, or other programming language and development tools. Examples of computer code include, but are not limited to, micro-code or micro-instructions, machine instructions, such as produced by a compiler, code used to produce a web service, and files containing higher-level instructions that are executed by a computer using an interpreter. For example, embodiments may be implemented using imperative programming languages (e.g., C, Fortran, etc.), functional programming languages (Haskell, Erlang, etc.), logical programming languages (e.g., Prolog), object-oriented programming languages (e.g., Java, C++, etc.) or other suitable programming languages and/or development tools. Additional examples of computer code include, but are not limited to, control signals, encrypted code, and compressed code.

While various embodiments have been described above, it should be understood that they have been presented by way of example only, and not limitation. Where schematics and/or embodiments described above indicate certain components arranged in certain orientations or positions, the arrangement of components may be modified. While the embodiments have been particularly shown and described, it will be understood that various changes in form and details may be made. Although various embodiments have been described as having particular features and/or combinations of components, other embodiments are possible having a combination of any features and/or components from any of embodiments described herein.

Where methods and/or events described above indicate certain events and/or procedures occurring in certain order, the ordering of certain events and/or procedures may be modified. Additionally, certain events and/or procedures may be performed concurrently in a parallel process when possible, as well as performed sequentially as described above.

What is claimed:

1. A non-transitory processor-readable medium storing code representing instructions to be executed by a processor, the code comprising code to cause the processor to:
   receive aerial data having a plurality of points arranged in a pattern;
   classify, using at least a machine learning model, each point from the plurality of points into a category from a plurality of non-binary categories;
   for each point from the plurality of points, identify a set of adjacent points from the plurality of points having a common category from the plurality of non-binary categories to define a shape from a plurality of shapes;
   define a polyline boundary of each shape from the plurality of shapes by analyzing with respect to a criterion a position of each point associated with a border of that shape relative to the position of at least one other point associated with the border of that shape;
   assign each shape from the plurality of shapes to a layer associated with the category from the plurality of non-binary categories for that shape from the plurality of shapes; and
   generate a file including at least one of a two-dimensional (2D) model or a three-dimensional (3D) model of aerial data using the polyline boundary of each shape from the plurality of shapes and the layer for each category from the plurality of non-binary categories.

2. The non-transitory processor-readable medium of claim 1, wherein the aerial data is from an aerial orthomosaic image formed by a plurality of pixels, each point from the plurality of points is associated with a pixel from the plurality of pixels in the aerial orthomosaic image.

3. The non-transitory processor-readable medium of claim 1, wherein the aerial data is from a point cloud.

4. The non-transitory processor-readable medium of claim 1, wherein each category from the plurality of non-binary categories is associated with one of a manmade structure or a geological feature.

5. The non-transitory processor-readable medium of claim 1, wherein the code to cause the processor to classify each point from the plurality of points into a category from the plurality of non-binary categories further comprises code to cause the processor to:
   classify, via the machine learning model, a point from the plurality of points into a set of possible categories from the plurality of non-binary categories; and
   select, from the set of possible categories, the category for the point from the plurality of points based on a predefined category hierarchy.

6. The non-transitory processor-readable medium of claim 1, wherein the aerial data includes elevation data associated with each point from the plurality of points.

7. The non-transitory processor-readable medium of claim 1, wherein the machine learning model includes at least one of a neural network, a full resolution residual network (FRRN), a decision tree model, a random forest model, a Bayesian network or a clustering model.

8. The non-transitory processor-readable medium of claim 1, wherein the code to cause the processor to define the polyline boundary includes code to cause the processor to define the polyline boundary for each shape from the plurality of shapes as (1) encompassing that shape and (2) distinct from the polyline boundary for the remaining shapes from the plurality of shapes.

9. The non-transitory processor-readable medium of claim 1, wherein the aerial data is verified using ground control points.

10. The non-transitory processor-readable medium of claim 1, wherein the criterion is a predetermined deviation threshold, the code to cause the processor to define the polyline boundary includes code to cause the processor to define the polyline boundary for that shape from the plurality of shapes as a straight line between a first point associated with the border and a second point associated with the border when a deviation of the position of each point associated with the border otherwise on the polyline boundary is less than the predetermined deviation threshold.

11. The non-transitory processor-readable medium of claim 1, wherein the code to cause the processor to identify the set of adjacent points from the plurality of points having the common category includes code to cause the processor to:
   identify the set of adjacent points from the plurality of points having the common category based on a category hierarchy, the category hierarchy being based on at least one characteristic associated with each category from the plurality of non-binary categories.

12. The non-transitory processor-readable medium of claim 1, wherein the aerial data is aerial data of a site of interest, the code further comprising code to cause the processor to:
  select the plurality of non-binary categories from a group of non-binary categories based at least in part on a set of characteristics associated with the site of interest; and
  define a category hierarchy for the plurality of non-binary categories based at least in part on the set of characteristics associated with the site of interest, the code to cause the processor to identify the set of adjacent points from the plurality of points having the common category includes code to cause the processor to:
  identify the set of adjacent points from the plurality of points having the common category based on the category hierarchy, the category hierarchy being based on at least one characteristic associated with each category from the plurality of non-binary categories.

13. An apparatus, comprising:
  a memory; and
  at least one processor operatively coupled to the memory, the at least one processor configured to receive data associated with a site of interest, the data including data representing a plurality of non-binary categories based on a set of characteristics of the site of interest and aerial data of the site of interest, the aerial data having a plurality of points arranged in a pattern,
  the at least one processor configured to execute a machine learning model to classify each point from the plurality of points into a set of non-binary categories from the plurality of non-binary categories, the at least one processor configured to select, for each point from the plurality of points, a category from the set of non-binary categories for that point based on a predefined category hierarchy,
  the at least one processor configured to, for each point from the plurality of points, identify a set of adjacent points from the plurality of points having a common category from the plurality of non-binary categories to define a shape from a plurality of shapes,
  the at least one processor configured to generate a file including at least one of a two-dimensional (2D) model or a three-dimensional (3D) model of aerial data using each shape from the plurality of shapes.

14. The apparatus of claim 13, wherein the aerial data is from an aerial orthomosaic image of the site of interest formed by a plurality of pixels, each point from the plurality of points is associated with a pixel from the plurality of pixels of the aerial orthomosaic image.

15. The apparatus of claim 13, wherein the aerial data is from a point cloud.

16. The apparatus of claim 13, wherein the at least one processor is configured to define a polyline boundary of each shape from the plurality of shapes by analyzing with respect to a criterion a position of each point associated with a border of that shape relative to the position of at least one other point associated with the border of that shape.

17. The apparatus of claim 13, wherein the at least one processor is configured to assign each shape from the plurality of shapes to a layer of the at least one of the 2D model or the 3D model that is associated with the category from the plurality of non-binary categories for that shape.

18. The apparatus of claim 13, wherein the aerial data includes elevation data associated with each point from the plurality of points.

19. The apparatus of claim 13, wherein each category from the plurality of non-binary categories is associated with at least one of a manmade structure or a geological feature.

20. A method, comprising:
  receiving, via at least one processor, data associated with a site of interest, the data including data representing a plurality of non-binary categories associated with the site of interest and aerial data of the site of interest, the aerial data having a plurality of points arranged in a pattern;
  classifying, based at least in part on the at least one processor executing a machine learning model, each point from the plurality of points into a category from the plurality of non-binary categories;
  identifying, via the at least one processor and for each point from the plurality of points, a set of adjacent points from the plurality of points having a common category from the plurality of non-binary categories to define a shape from a plurality of shapes;
  defining, via the at least one processor, a polyline boundary of each shape from the plurality of shapes by analyzing with respect to a criterion a position of each point associated with a border of that shape relative to a position of at least one other point associated with the border of that shape;
  assigning, via the at least one processor, each shape from the plurality of shapes to a layer associated with the category from the plurality of non-binary categories for that shape from the plurality of shapes; and
  generating a file including at least one of a two-dimensional (2D) model or a three-dimensional (3D) model of aerial data using the polyline boundary of each shape from the plurality of shapes and the layer for each category from the plurality of non-binary categories.

21. The method of claim 20, wherein the criterion is a predetermined deviation threshold, the defining the polyline boundary includes defining the polyline boundary for that shape from the plurality of shapes as a straight line between a first point associated with the border of that shape and a second point associated with the border of that shape when a deviation of the position of each point associated with the border otherwise on the polyline boundary is less than the predetermined deviation threshold.

22. The method of claim 20, wherein the aerial data includes elevation data associated with each point from the plurality of points.

23. The method of claim 20, further comprising:
  selecting the plurality of non-binary categories from a group of non-binary categories based at least in part on a set of characteristics associated with the site of interest; and
  defining a category hierarchy for the plurality of non-binary categories based at least in part on the set of characteristics associated with the site of interest,
  the identifying the set of adjacent points from the plurality of points having the common category includes identifying the set of adjacent points from the plurality of points having the common category from the plurality of non-binary categories based on the category hierarchy.

* * * * *